(12) United States Patent
Lizotte et al.

(10) Patent No.: US 6,653,593 B2
(45) Date of Patent: Nov. 25, 2003

(54) CONTROL SYSTEM FOR ABLATING HIGH-DENSITY ARRAY OF VIAS OR INDENTATION IN SURFACE OF OBJECT

(75) Inventors: Todd E. Lizotte, Manchester, NH (US); Orest Ohar, Hooksett, NH (US)

(73) Assignee: NanoVia, LP, Londonderry, NH (US)

( * ) Notice: Subject to any disclaimer, the term of this patent is extended or adjusted under 35 U.S.C. 154(b) by 0 days.

(21) Appl. No.: 10/183,806

(22) Filed: Jun. 26, 2002

(65) Prior Publication Data

US 2002/0162825 A1 Nov. 7, 2002

Related U.S. Application Data

(63) Continuation-in-part of application No. 09/540,366, filed on Mar. 31, 2000, now Pat. No. 6,420,675, which is a continuation-in-part of application No. 09/514,084, filed on Feb. 28, 2000, now Pat. No. 6,310,701.
(60) Provisional application No. 60/158,478, filed on Oct. 8, 1999.

(51) Int. Cl.[7] .............................................. B23K 26/36
(52) U.S. Cl. ................................................... 219/121.7
(58) Field of Search ......................... 219/121.7, 121.73, 219/121.68, 121.61, 121.74, 121.75, 121.76, 121.77, 121.82, 121.69, 121.83, 121.8, 121.81; 359/214, 15, 17, 202; 264/400; 216/17, 65

(56) References Cited

U.S. PATENT DOCUMENTS

| | | | |
|---|---|---|---|
| 4,326,824 A | 4/1982 | Lasermann et al. ......... 409/132 |
| 4,348,253 A | 9/1982 | Subbarao et al. ........... 156/643 |
| 4,473,737 A | 9/1984 | Anthony ................ 219/121 LL |
| 4,532,402 A | 7/1985 | Overbeck ............. 219/121 LU |
| 4,681,452 A | 7/1987 | Watanabe ................... 356/375 |
| 4,803,336 A * | 2/1989 | Myer ..................... 219/121.68 |
| 4,959,119 A | 9/1990 | Lantzer ...................... 156/644 |
| 5,108,785 A | 4/1992 | Lincoln et al. ............... 427/96 |
| 5,126,648 A | 6/1992 | Jacobs ....................... 318/640 |
| 5,157,235 A | 10/1992 | Okumura et al. ...... 219/121.68 |
| 5,257,091 A | 10/1993 | Caicedo, Jr. et al. ....... 356/358 |
| 5,293,025 A | 3/1994 | Wang .................... 219/121.71 |
| 5,481,407 A | 1/1996 | Smith ........................ 359/742 |
| 5,509,553 A | 4/1996 | Hunter, Jr. et al. ........... 216/13 |
| 5,523,543 A | 6/1996 | Hunter, Jr. et al. ..... 219/121.62 |
| 5,552,574 A | 9/1996 | Merlin ................... 219/121.69 |
| 5,571,429 A | 11/1996 | Smith ..................... 219/121.68 |
| 5,593,606 A | 1/1997 | Owen et al. ........... 219/121.71 |
| 5,614,114 A | 3/1997 | Owen ..................... 219/121.66 |
| 5,633,735 A | 5/1997 | Hunter, Jr. et al. ........... 359/15 |
| 5,702,662 A | 12/1997 | Smith ......................... 264/400 |
| 5,737,122 A | 4/1998 | Wilt et al. ................... 359/436 |
| 5,808,272 A | 9/1998 | Sun et al. .............. 219/121.68 |
| 5,811,754 A | 9/1998 | Nakatani et al. ........ 219/121.83 |
| 5,841,099 A | 11/1998 | Owen et al. ........... 219/121.69 |
| 5,847,960 A | 12/1998 | Cutler et al. ........... 364/474.29 |
| 5,894,530 A | 4/1999 | Wilt ............................ 382/312 |
| 5,920,973 A | 7/1999 | Kosmowski ................ 29/26 A |
| 5,984,079 A | 11/1999 | Garcia ................... 198/397.02 |
| 5,990,444 A | 11/1999 | Costin ................... 219/121.69 |
| 5,997,223 A | 12/1999 | Kosmowski ................ 408/124 |
| 6,022,905 A | 2/2000 | Harris et al. .................... 522/2 |
| 6,086,204 A | 7/2000 | Magnante ................... 351/212 |
| 6,252,196 B1 * | 6/2001 | Costin et al. .......... 219/121.69 |
| 6,388,780 B1 * | 5/2002 | Monaghan et al. ........... 359/35 |
| 6,420,675 B1 * | 7/2002 | Lizotte et al. ............ 219/121.7 |

OTHER PUBLICATIONS

Vainos, N.A., S. Mailis, S. Pissadakis, L. Boutsikaris, P.J.M. Parmiter, P. Dainty and T. J. Hall, "Excimer laser use for microetching computer–generated holographic structures," Applied Optics, vol. 35, No. 32, Nov. 10, 1996, pp. 6304–6319.

* cited by examiner

Primary Examiner—Tom Dunn
Assistant Examiner—Jonathan Johnson
(74) Attorney, Agent, or Firm—Davis & Bujold PLLC

(57) ABSTRACT

A laser beam delivery system for ablating a desired array of features in an object to be processed. The imaging system comprises a laser, a shaping apparatus for shaping the laser beam into a plurality of separate laser beams, first and second repeat positioners for redirecting the beams, a converging mechanism for converging the laser beams through a clear aperture of a reflective mirror of the first repeat positioner, and a focusing member for focusing the laser beams at a desired one of a plurality of holographic imaging segments. Each one of the holographic imaging segments, comprising the holographic imaging lens, forms a desired formation in a surface of the object to be processed. A number of the components are housed within a rotatable module and a rotational drive is connected to the rotatable module to facilitate rotation thereof relative to the optical axis.

20 Claims, 14 Drawing Sheets

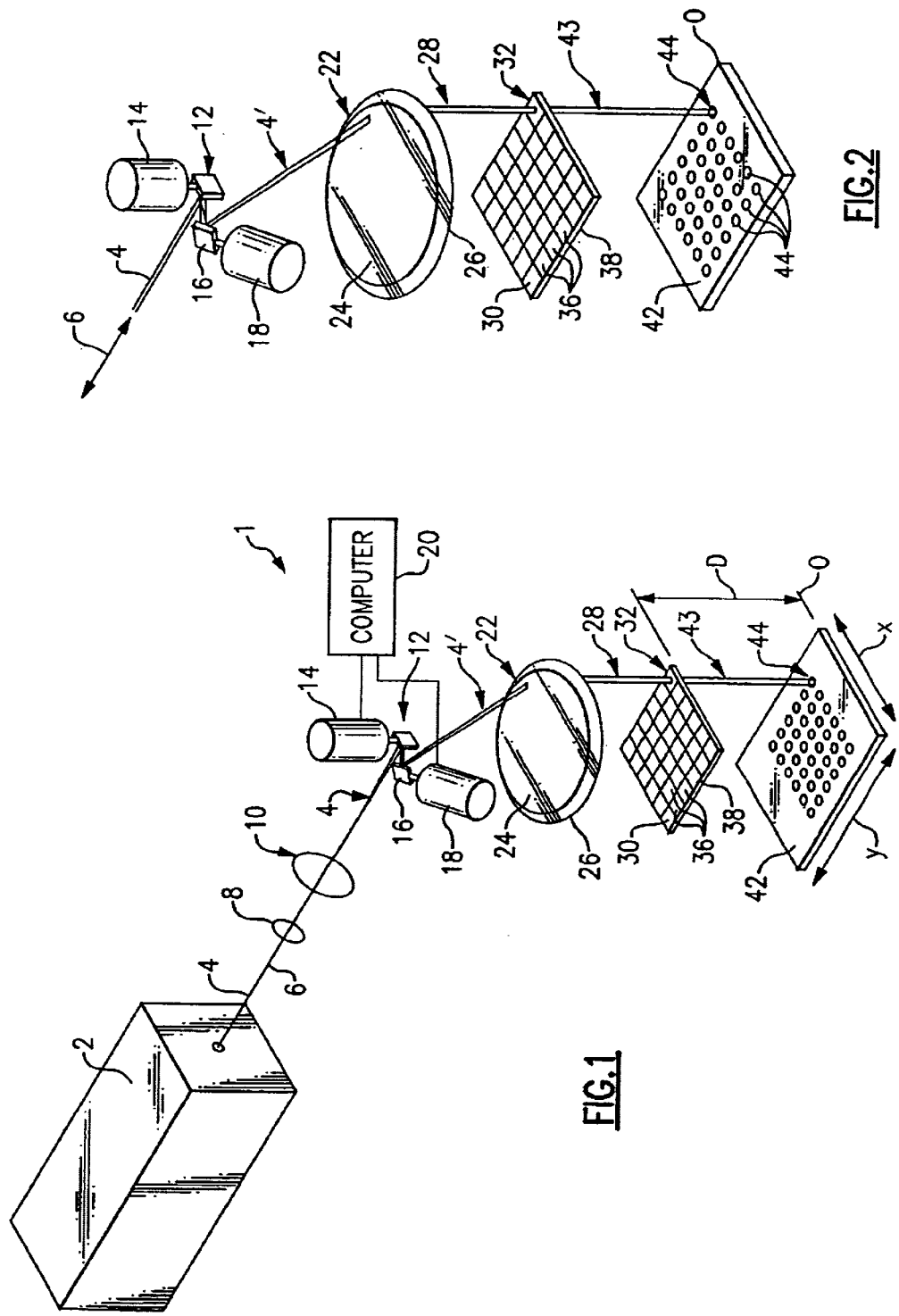

Gaussian

Psuedo Flat Top

CONTROL SYSTEM FOR ABLATING HIGH-DENSITY ARRAY OF VIAS OR INDENTATION IN SURFACE OF OBJECT

This application is a continuation-in-part of Ser. No. 09/540,366 filed Mar. 31, 2000 now U.S. Pat. No. 6,420,675 which is a continuation-in-part of Ser. No. 09/514,084 filed Feb. 28, 2000, now U.S. Pat. No. 6,310,701 B1, which claims benefit of provisional Serial No. 60/158,478 filed Oct. 8, 1999.

FIELD OF THE INVENTION

The present invention relates to a system for burning, drilling, or otherwise forming one or more desired vias, blind vias or other surface indentations, indicia, markings and/or other formations in a surface of a desired object, such as a substrate.

BACKGROUND OF THE INVENTION

There are currently available a variety of systems for forming a hole, a via, a blind via or some other surface indentation in an exterior surface of an object, but many of these systems are very expensive to purchase and operate at relatively slow production rates.

SUMMARY OF THE INVENTION

Wherefore, the present invention seeks to overcome the above noted drawbacks of the prior art by providing a system which is relatively inexpensive to purchase and maintain while, at the same time, operates at increased production speeds so that the desired vias, blind vias, or other surface indentations, apertures or other surface markings can be achieved in a surface of a desired object during a shorter period of production time.

A further object of the present invention is to provide a method and apparatus for ablating a desired high-density array or pattern of vias or other surface indentations or formations in a surface of an object to be processed.

Another object of the invention is to facilitate use of a variety of different lasers which operate at different wavelengths and pulse durations, to minimize the associated costs in connection with ablating a high-density array of blind vias, vias or other surface indentations or formations in a surface of an object to be processed. It is to be appreciated that an ultraviolet, a visual, an infrared as well as other types of lasers, extending across the entire spectrum, could be utilized in accordance with the teaching of the present invention.

Yet another object of the present invention is to provide a method and apparatus which allows the number of vias or other indentations or formations, to be formed in a surface of an object being processed, to be easily varied during production of the same by control of the intensity and/or duration of a substantially collimated or non-collimated light beam emanating from the laser.

Still another object of the invention is to provide an apparatus which is relatively less inexpensive to purchase and operate, in comparison to other known systems, while still improving the production rates of the objects to be processed.

A further object of the present invention is to increase the duty cycle of the laser so the laser operates for a shorter duration of time.

Still another object of the present invention is to provide a two command structure which allows a motion control card to synchronize the X-axis and the Y-axis repeat positioners (e.g. the galvanometers), the product handling system (which controls movement of the product to be processed in the X and Y-axes) and the laser so that all three of these components operate at an optimum performance level and allow superior efficiency of the present imaging system than is conventionally achieved in the prior art devices and systems.

The present invention also relates to a laser beam delivery system for ablating a desired array of features in an object to be processed, the laser beam delivery system comprising: a laser for generating and outputting a coherent laser beam; a shaping apparatus for receiving the coherent laser beam output by the laser and for shaping the laser beam into a plurality of separate laser beams; first and second repeat positioners for redirecting a path of the plurality of separate laser beams; a converging mechanism for redirecting the plurality of separate laser beams through a clear aperture of a reflective mirror of the first repeat positioner; a focusing member for receiving the redirected plurality of laser beams from the first and second repeat positioners and focusing each of the plurality of laser beams at a desired one of a plurality of holographic imaging segments forming a holographic imaging lens; and each one of the holographic imaging segments, comprising the holographic imaging lens, forming a desired formation in a surface of the object to be processed.

BRIEF DESCRIPTION OF THE DRAWINGS

The invention will now be described, by way of example, with reference to the accompanying drawings in which:

FIG. 1 is a perspective view diagrammatically showing the entire system of the present invention;

FIG. 2 is an enlarged perspective diagrammatic view of FIG. 1 showing the laser imaging system according to the present invention;

DESCRIPTION OF THE PREFERRED EMBODIMENTS

Figure 3:
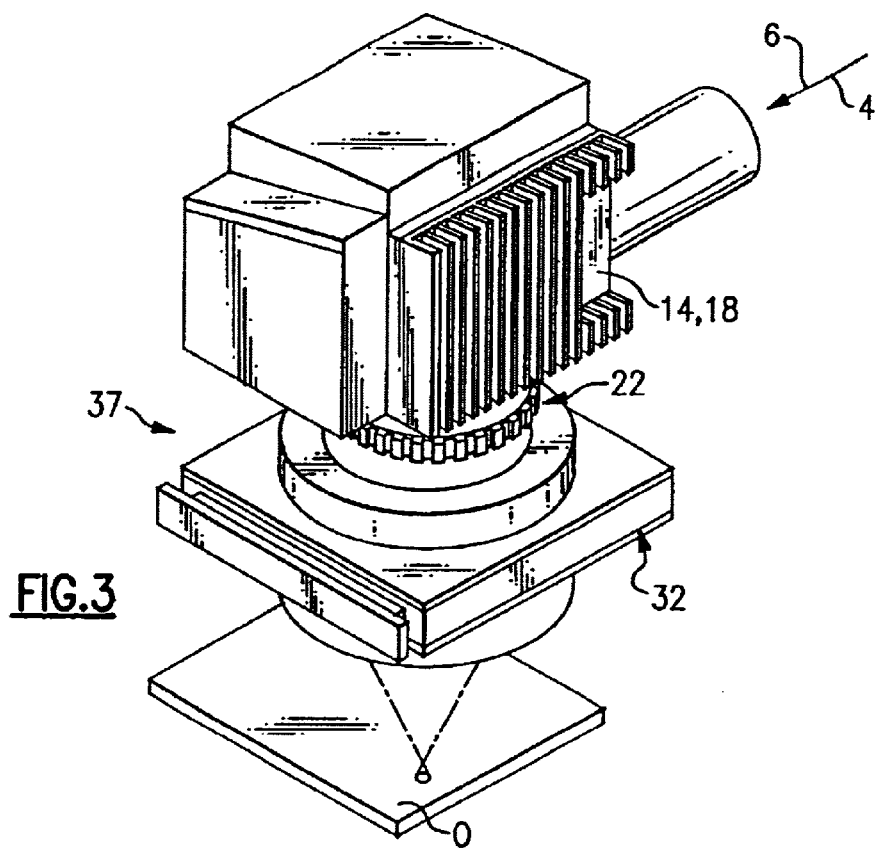
FIG. 3 is a diagrammatic representation showing an X-axis and Y-axis automated repeat positioner, a collimating lens and a holographic lens which are combined as a single unit for use as the laser imaging system of the present invention.

Turning now to FIG. 1–4, a detailed description of the imaging system 1 apparatus for ablating high-density array of vias or indentations in a surface of an object, according to the present invention, will now be provided. As can be seen in FIG. 1, a conventional laser 2 (only diagrammatically shown in this Figure) is employed for generating and outputting a laser beam 4. It is to be appreciated that the laser 2 can be either excimer or non-excimer laser and further details and operating parameters for the preferred laser, for use with the present invention, will be provided below. The laser beam 4, generated by the laser 2, is either an ultraviolet, a visible, an infrared, a coherent radiation beam or some other light radiation beam 4 which is supplied along a laser axis 6 toward at least a first expansion telescope or expansion lens 8 and also preferably then supplied to a second expansion telescope or expansion lens 10. The purpose of the expansion telescope or lens 8 and/or 10 is/are to suitably expand the diameter of the generated ultraviolet, visible, infrared or other light radiation laser beam 4 so as to have a desired resulting expanded laser diameter for the laser beam 4. As such expansion feature and teaching is conventional and well known in the art, a further detailed discussion concerning the same is not provided.

The expanded ultraviolet, visible, infrared or other light radiation beam 4 then continues, along the laser axis 6, and is directed at and impinges on a first reflective mirror 12 of an X-axis automated repeat positioner 14 of the system 1. The first reflective mirror 12 of the X-axis automated repeat positioner 14 controls the X-coordinate, along the surface 42 of the object to be processed O, at which the ultraviolet, visible, infrared or other light radiation laser beam 4 will be reflected. The first reflective mirror 12 suitably redirects or alters the path of substantially all of the ultraviolet, visible, infrared or other light radiation laser beam 4 and then reflects the laser beam toward a second reflective mirror 16, controlled by a Y-axis automated repeat positioner 18 of the system 1. The second reflective mirror 16, associated with the Y-axis automated repeat positioner 18, controls the Y-coordinate, along the surface 42 of the object to be processed O, at which the ultraviolet, visible, infrared or other light radiation laser beam 4 will be reflected. The expanded ultraviolet, visible, infrared or other light radiation beam 4 impinges on the second reflective mirror 16 and the second reflective mirror 16 suitably redirects or alters the path of the ultraviolet, visible, infrared or other light radiation laser beam 4 toward a rear surface 24 of a flat field collimating lens or some other refractive, defractive or holographic component 22, which is conventional and well known in this art.

Both the X-axis automated repeat positioner 14 and the Y-axis automated repeat positioner 18 are coupled to a computer 20 which controls the reflective positions of the first and second reflective mirrors 12 and 16, to suitably reflect and/or redirect the ultraviolet, visible, infrared or other light radiation laser beam at a desired impinging location along the rear surface 24 of the field collimating lens or holographic component 22. As such automated control feature of the X-axis and the Y-axis automated repeat positioners 14 and 18 is conventional and well known in the art, a further detail discussion concerning the same is not provided.

A suitable X-axis automated repeat positioner or a Y-axis automated repeat positioner 14 or 18 is sold by Cambridge Technology of Cambridge, Mass., as 6870M Optical Scanner Heads. It is to be appreciated that other currently available scanners or repeat positioners, which facilitate accurate reflecting and/or redirecting of a supplied laser beam, at a desired location of an X, Y coordinate system, could also be employed with the teaching of the present invention.

The reflected ultraviolet, visible, infrared or other light radiation laser beam 4' enters the rear surface 24 of the field collimating lens or other holographic component 22, passes therethrough and is suitably altered in a conventional manner by the inherent characteristics of the field collimating lens or other holographic component 22 so that the ultraviolet, visible, infrared or other light radiation laser beam which is emitted from the front surface 26 of the field collimating lens or other holographic component 22 is a substantially collimated beam 28. This substantially collimated beam 28 is emitted and directed, by the front surface 26 of the field collimating lens or other holographic component 22, toward a desired area or portion of a rear surface 30 of a holographic imaging lens 32 and strikes and impinges on that desired area or portion.

The holographic imaging lens 32 is designed such that as the light enters by way of the rear surface 30 of one of the holographic imaging segments 36, the light will be focused, by that holographic imaging segment 36 of the holographic imaging lens 32, at a desired location or locations along a top surface 42 of the object to be processed O. The top surface 42 of the object to be processed O is located at a desired working distance D, for example, between 5 mm and 1000 mm, and preferably between about 200 to 300 mm from the front surface 38 of the holographic imaging lens 32. The altered light is emitted from the front surface 38 of the holographic imaging lens 32 as focused light beam 43.

This focused light beam 43 is directed at a desired location or locations-depending upon the inherent characteristics of the holographic imaging segment 36, along the top or other desired surface 42 of the object to be processed O for drilling, burning or otherwise forming a desired blind via(s), aperture(s), opening(s), indicia, indentation(s) or other surface formation(s) 44 therein of a desired size and a desired depth. It is to be appreciated that the size of the formation(s) 44 is determined and/or defined by the design characteristics of each holographic imaging segment 36 of the holographic imaging lens 32. In addition, the depth of the formation(s) 44 is a direct function of the duration or amount of pulses of the laser 2 emitted at the top surface 42 of the object to be processed. That is, the longer the duration or greater of the number of pulses of the laser 2, the greater the depth of the desired blind via(s), aperture(s), opening(s), indicia, indentation(s) or other surface formation(s) 44 in the object to be processed O, while the shorter the duration or the smaller the number of pulses from the laser 2, the smaller the depth of the desired blind via(s), aperture(s), opening(s), indicia, indentation(s) or other surface formation(s) 44 in the object to be processed O. As diagrammatically shown in FIGS. 1 and 2, the focused laser beam 43 is shown drilling, burning or otherwise forming a desired formation(s) 44, such as a blind via, in the top surface 42 of the object to be processed O.

An important distinction between the present invention and the prior art is that X-axis and the Y-axis automated repeat positioner 14, 18 are particularly adapted to reflecting the laser beam at only selected or desired rear area or areas of the holographic imaging lens 32, not the entire rear surface of the holographic imaging lens 32. As is conventionally done in the prior art, the scanners are employed to scan the laser beam across the entire rear surface of the holographic imaging lens, not only at a selected area or areas, as achieved by the present invention.

With reference to FIG. 3, a X-axis and Y-axis automated repeat positioner, a collimating lens and a holographic unit combined assembly 37 can be seen. The X and Y-axis automated repeat positioners are generally designated as 14, 18, the collimating lens or other holographic component 22 is located beneath the automated positioners, and the holographic imaging lens 32 is located to receive the collimated light from the collimating lens or other holographic component 22. The arrangement results in a compact design for the main components of the imaging system 1 of the present invention.

Figure 4:
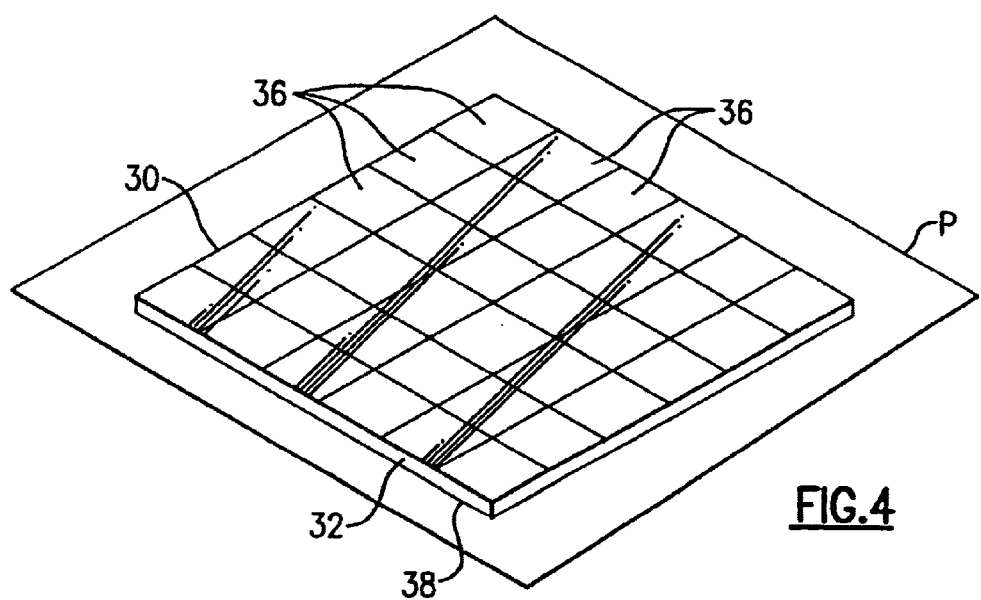
FIG. 4 is a perspective view diagrammatically showing a mask for use with the laser imaging system of the present invention.

As can be seen in further detail in FIG. 4, the holographic imaging lens 32, according to the present invention, is partitioned into a plurality of desired separate holographic imaging segments 36 and each holographic imaging segment 36 is designed to form, burn or drill at least one, and possibly two or more, desired size via, blind via, hole, aperture, indicia, indentation, feature or other formation 44 in the top surface 42 of the object to be processed O. The holographic imaging lens 32, as shown in FIGS. 1, 2 and 4, is partitioned into thirty-six (36) different holographic imaging segment 36 and each holographic imaging segment 36 is designed to form, according to the first embodiment, a corresponding blind desired blind via(s), aperture(s), opening(s), indicia, indentation(s) or other surface formation(s) 44 in the top surface 42 of the object to be processed O.

It is to be appreciated that the number of holographic imaging segments 36, being incorporated into the holographic imaging lens 32, can vary from application to application. Further, the number of desired blind via(s), aperture(s), opening(s), indicia, indentation(s), feature(s) or other surface formation(s) 44, to be formed by each holographic imaging segment 36, can be vary from application to application. Accordingly, the holographic imaging lens 32, according to the present invention, can be designed to drill, form or otherwise burn only a few or many tens of thousands of desired blind via(s), aperture(s), opening(s), indicia, indentation(s), feature(s) or other surface formation(s) 44 in the desired object to be processed O. The important feature, according to the present invention, is that all the holographic imaging segments 36 are arranged and located closely adjacent one another so as to all lie in the same plane P, which plane extends parallel to the top surface 42 of the object to be processed O, so as to be readily illuminated with the focused light beam 43.

The holographic segments 36 are either glued or otherwise are affixed to one another in a conventional manner or a perimeter retaining ring or some other retaining member encases and maintains the holographic segments in their close adjacent planar relationship. Alternatively, the holographic imaging lens 32 can be formed from a single unitary piece of material and each holographic segment can be designed to form the desired blind via(s), aperture(s), opening(s), indicia, indentation(s), feature(s) or other surface formation(s) 44.

According to the present invention, the X-axis and the Y-axis automated repeat positioners 14 and 18 are controlled by the computer 20, or other automated system to select the desired area or portion of the rear surface 24 of the field collimating lens or other holographic component 22 to be illuminated by the substantially collimated beam 28. The substantially collimated beam 28 passes through the field collimating lens or other holographic component 22 and emanates from a front surface 26 thereof toward the rear surface of a desired one of the holographic imaging segments 36 of the holographic imaging lens 32. The substantially collimated beam 28 strikes a desired area or portion, within the desired holographic imaging segment 36, and the substantially collimated beam 28 is focused, in a conventional manner, by the holographic imaging segment 36 to result in the focused beam 43 which facilitates drilling, burning, or formation of the desired blind via(s), aperture(s), opening(s), indicia, indentation(s), feature(s) or other surface formation(s) 44 in the top surface 42 of the object to be processed O.

The holographic imaging lens 32, which comprises a plurality of holographic imaging segments 36, can be obtained from a variety of sources such as, for example, Diffraction Ltd. of Waitsfield, Vt., Digital Optics Corporation, of Charlotte, N.C., MEMS Optical, LLC. of Huntsville, Ala. and Rochester Photonics Corp. of Rochester, N.Y.

It is to be appreciated that if a total of thirty-six (36) holes or formations 44 were to be formed in the top surface 42 of the object to be processed O, as shown in FIGS. 1 and 2, each one of the holographic imaging segments 36 of the holographic imaging lens 32 would be designed to form a single desired blind via(s), aperture(s), opening(s), indicia, indentation(s), feature(s) or other surface formation(s) 44 and be sequentially illuminated with the substantially collimated beam 28, in a desired sequential illumination order, for a desired number of pulses or a desired pulse duration. Alternatively, if only some desired blind via(s), aperture(s), opening(s), indicia, indentation(s), feature(s) or other surface formation(s) 44 are required to be burned, drilled or formed in the top surface 42 of the object to be processed O, but other desired blind via(s), aperture(s), opening(s), indicia, indentation(s), feature(s) or other surface formation(s) 44 are not required, only the holographic imaging segments 36 which are designed to form the desired blind via(s), aperture(s), opening(s), indicia, indentation(s), feature(s) or other surface formation(s) 44 in the top surface 42 of the substrate to be processed O are illuminated with the substantially collimated beam 28 while the holographic imaging segments 36, which would form the unwanted blind via(s), aperture(s), opening(s), indicia, indentation(s), feature(s) or other surface formation(s) 44 in the top surface 42 of the substrate to be processed O, are not illuminated with the substantially collimated beam 28.

The holographic imaging lens 32, as can be seen in FIG. 4, essentially comprises a plurality of separate holographic imaging lens or segments 36 which are all located closely adjacent one another, in a desired orientation and all lying substantially in the same plane P to form a continuous unitary component. This arrangement facilitates a compact design of the holographic imaging lens 32 and allows the system to selectively and readily control which holographic imaging segment or segments 36, of the holographic imaging lens 32, are activated during production of a desired substrate or object to be processed O via appropriate control of the X-axis and the Y-axis automated repeat positioners 14 and 18. Such construction provides the system, according to the present invention, with greater flexibility and allows variation in the amount and location of the desired blind via(s), aperture(s), opening(s), indicia, indentation(s), feature(s) or other surface formation(s) 44 to be formed, burnt or drilled in the top surface 42 of object to be processed O during commercial production of the same.

Figure 5:
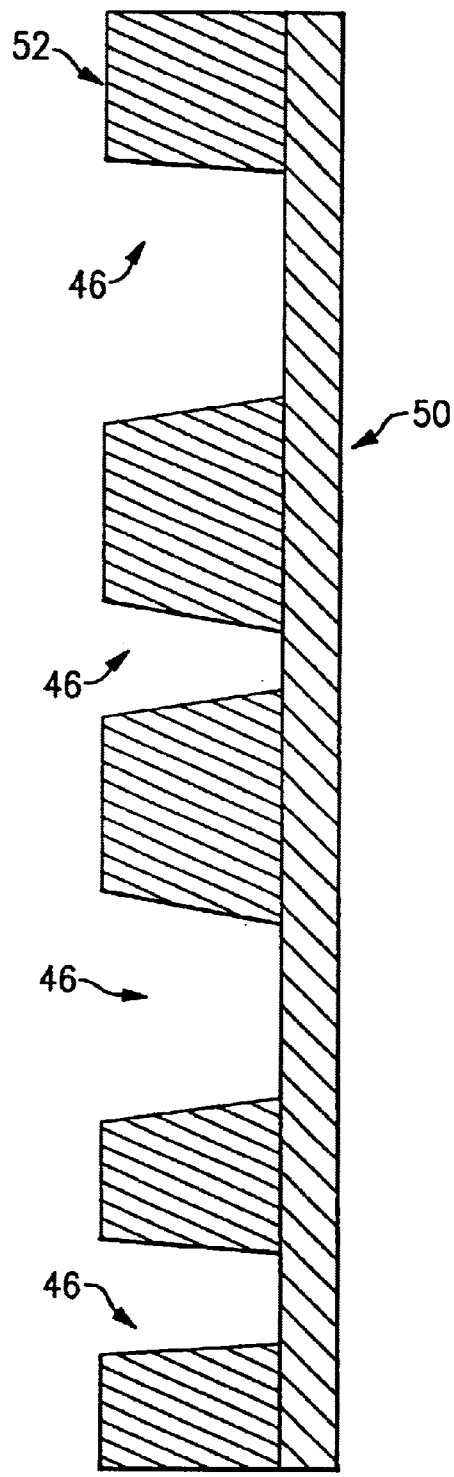
FIG. 5 is a diagrammatic transverse cross-sectional view of substrate having a plurality of different sizes blind vias formed therein by the laser imaging system of the present invention.

With reference to FIG. 5, an example of an object to be processed O can be seen. As shown in this Figure, the object to be processed O contains a base layer 50 which comprises, for example, a standard metal such as aluminum, copper, gold, molybdenum, nickel, palladium, platinum, silver, titanium, tungsten, metal nitrides or a combination(s) thereof. The thickness of the metal base layer 50 may vary but typically ranges between about 9 to about 36 $\mu$m and may be as thick as about 70 $\mu$m. The top layer 52 comprises, for example, a standard organic dielectric materials as BT, cardboard, cyanates esters, epoxies, phenolics, polyamides, PTFE, various polymer alloys, or combinations thereof. The thickness of the top layer 52 is generally thicker than the base layer 50 and typically ranges between about 50 to about 200 $\mu$m.

As can be seen in FIG. 5, a plurality of blind vias 46 are formed therein and some of the blind vias 46 can have different diameters. As noted above, the diameter of the blind vias 46 are determined by the focusing characteristics of the holographic imaging lens 32, e.g. the holographic imaging lens focuses the supplied collimated light beam 28 over a wider area to achieve larger diameter blind via and focuses the light over a narrower area to achieve narrower diameter blind via. In both cases, it is to be appreciated that the duration or number of pulses are controlled by the imaging system 1 to insure that the entire top layer 52 of the object to be processed O is obliterated to thereby expose the underlying metal base layer 50 while being of a substantially short enough intensity and duration so as not to in any way destroy or obliterate the underlying base layer 50.

Figure 6:
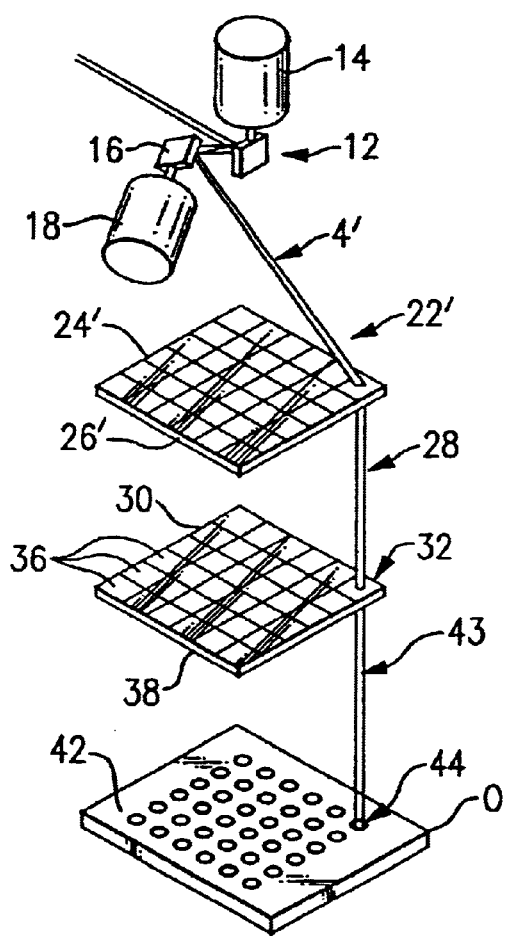
FIG. 6 is a diagrammatic perspective view of a second embodiment of the laser imaging system of the present invention.

It is to be appreciated that a variation of the holographic imaging lens, as shown in FIG. 6, can be substituted in place of the field collimating lens 22. If a collimating holographic imaging lens 22' is employed as the field collimating lens, then the collimating holographic imaging lens 22' is designed so as to receive light from the X-axis and the Y-axis automated repeat positioners 14 and 18 and redirect the supplied ultraviolet, visible, infrared or other light radiation laser beam 4, as a substantially collimated beam 28, at a desired rear surface of one of the holographic imaging segments 36 of the holographic imaging lens 32. The collimating holographic imaging lens 22' is designed to collimate the supplied light beam and redirect the beam 4' light toward the holographic imaging lens 32 so that the substantially collimated beam 28 enters the rear surface of the holographic imaging lens 32 at an angle of about of between about 0° to about 90° or some other predetermined angle depending upon the design parameters of the imaging system 1.

The inventors have appreciated that if the substantially collimated beam 28, supplied by the field collimating lens or other holographic component 22, is redirected at the rear surface of the holographic imaging lens 32 at an angle of about 45° or so, the efficiency of the holographic imaging lens 32 is significantly increased over the efficiency when the substantially collimated beam 28 is redirected at the rear surface of the holographic imaging lens 32 at an angle of about 90°. That is, the efficiency of the holographic imaging lens 32 is less when the substantially collimated beam 28 enters the rear surface of the holographic imaging lens 32 at an angle of about 90° while the efficiency increases if the substantially collimated beam 28 enters the rear surface of the holographic imaging lens 32 at a suitable angle of about between 0° and 90°. Accordingly, the desired angle in which the substantially collimated beam 28 enters the rear surface of the holographic imaging lens 32 can vary, from application to application, and can be determined by trial and error depending upon the parameters of the imaging system 1. Therefore, by using a collimating holographic imaging lens as the field collimating lens 22, the overall efficiency of this system can be increased without changing or modifying any of the other system requirements or parameters.

Figure 7:
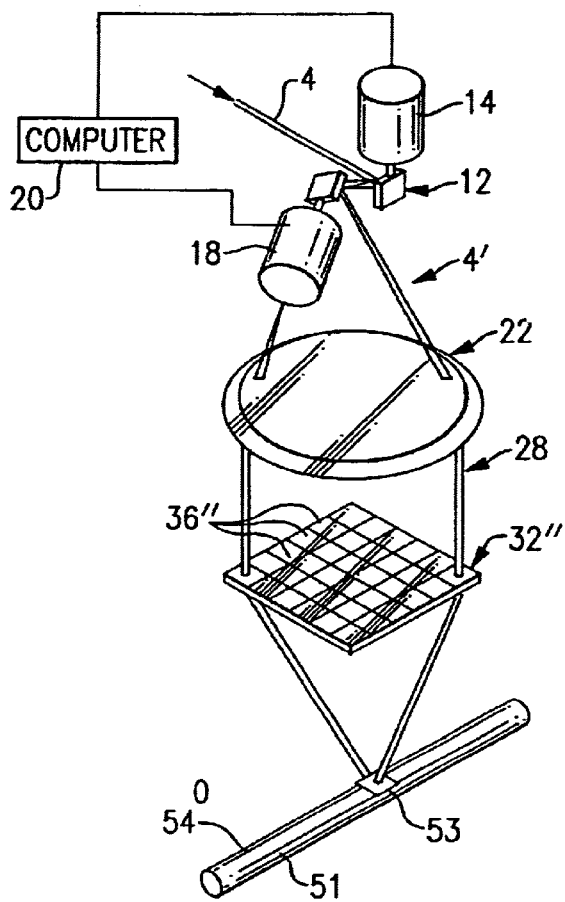
FIG. 7 is a diagrammatic perspective view of a third embodiment the laser imaging system, according to the present invention, for forming indicia on either a stationary or a moving object to facilitate use of the laser imaging system as a typewriter.

Turning now to FIG. 7, the holographic imaging lens 32 can be designed to result essentially in a holographic imaging keyboard 32", e.g. there can be twenty-six (26) holographic imaging segments 36" with each holographic segment being designed to form, burn or drill a one of the 26 letters of the alphabet, an additional ten (10) holographic imaging segments 36" with each additional holographic segment being designed to form, burn or drill one number from zero through 9, and a further plurality of holographic imaging segments 36" with each further holographic segment being designed to form, burn or drill desired punctuation, indicia, emblem, design logo, etc. By operation of the laser (not shown in this Figure) and adequately controlling of the X-axis and the Y-axis automated repeat positioners 14, 18, via the computer 20 as described above, the ultraviolet, visible, infrared or other light radiation laser beam 4 can be suitably collimated and supplied at a rear surface of a desired one of the holographic imaging segments 36" of the holographic imaging keyboard 32" to type, drill or form a desired letter, numeral, indicia, etc., in a top surface of an object to be processed, e.g. a cable or wire 51 running at high speed which is to have a desired marking, such as "A 0903 C", formed in an exterior surface thereof.

According to this embodiment, each image or other indicia to be formed by the holographic imaging keyboard 32" is focused by an appropriated one of the holographic imaging segments 36", once that segment is struck with the supplied ultraviolet, visible, infrared or other light radiation laser beam 4, to form the desired indicia at the same area or "printing location" 53. Accordingly, during operation of the imaging system 1, as a cable or wire 51, for example, moves past the "printing location" 53, the X-axis and the Y-axis automated repeat positioners 14, 18 are controlled by the computer 20 to select the desired one of the holographic imaging segment(s) 36" so as to type, burn, drill or form a desired letter, numeral, character, indicia, etc., in an exterior surface 54 of the wire 51 or other object as the wire 51 moves past the "printing location" 53. It is to be appreciated that the system, according to the present invention, incorporating the holographic imaging keyboard 32" operates at a very high speed such that the desired letter, numeral, character, indicia, etc., are essentially printed in sequential order, one after the other, to result in a desired imprinted pattern, e.g. "A 0903 C", on the wire 51.

Instead of using alphanumeric characters for the keyboard, each segment 36" can be provided with suitable light altering information for forming a desired bar code or other convention and when known marking indicia on an exterior surface of an object as it moves relative to the imaging system 1 or remains stationary at the "printing location" 53. As such teaching is conventional and well known to those skilled in the art, a further detailed description concerning the same will not be provided.

The above described embodiment is particularly useful for marking alpha-numeric characters at a rate that is approximately double the rate of any known marking system currently available on the market. The imaging system 1 uses a specially designed segmented array to create the required surface marks, which may be, for example, bar codes, letters, numbers, punctuation marks, logos, foreign characters, etc. This segmented array is designed to image every character of the array at the same location while the object or component, requiring the surface marking, is suitably moved or indexed relative to the printing zone or location 53 so as to mark the desired bar code(s), letter(s), number(s), punctuation mark(s), logo(s), foreign character (s), etc., in the exterior surface of the object or component.

A further application of the imaging system 1, according to the present invention, is to for use with marking different fiber materials with a code or code identifying or designating a specific production batch number(s), date(s), production facility, and other desired information that would be helpful or beneficial to a forensic investigator(s) when investigating a crime scene or when explosives have been used. Such small fibers can be made from a host of materials such as Kevlar®, carbon, glass, quartz, stainless steel, plastic, etc. The imaging system 1, according to the present invention, will allow these fibers to be effectively processed or marked, at extremely low costs and at a high speed, to assist with identification.

A further application of the present invention is two-dimensional bar code marking at high speed. The imaging system 1, according to the present invention, can be configured to provide high speed production marking of two-dimensional bar codes onto a either a stationary or a moving surface of a product or object. The system's segmented lens array can be used to image a series or group of associated indentations or other surface markings that can be formed into a two-dimensional bar code or other indicia that can be read using standard optical character recognition software. This method and system for marking is similar to the way the present invention drills, burns or forms the holes of a nozzle array except the system will only sufficiently mark the top surface to form the desired two-dimensional bar code character or other indicia. It is to be appreciated that a plurality of closely arranged and aligned indentations or surface marks will comprise or form each desired bar code(s), letter(s), number(s), punctuation, mark(s), logo(s), foreign character(s), etc. The imaging system 1 offers an extremely high rate marking capability that is currently not available by prior art marking systems.

Figure 8:
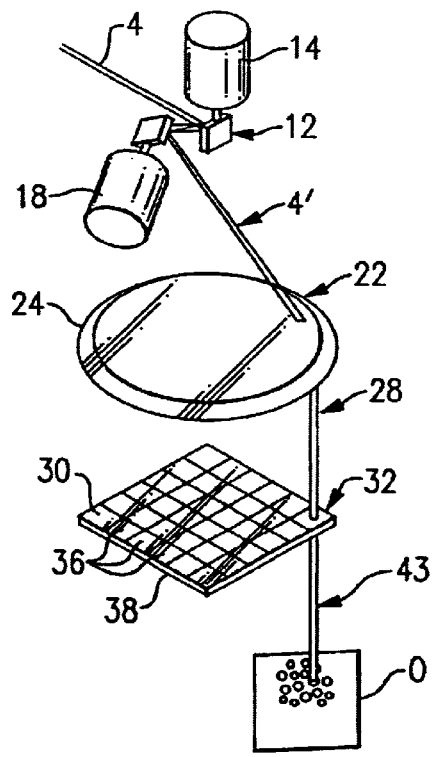
FIG. 8 is a diagrammatic perspective view of a fourth embodiment the laser imaging system, according to the present invention, for forming a desired nozzle array on a stationary object.
Figure 9:
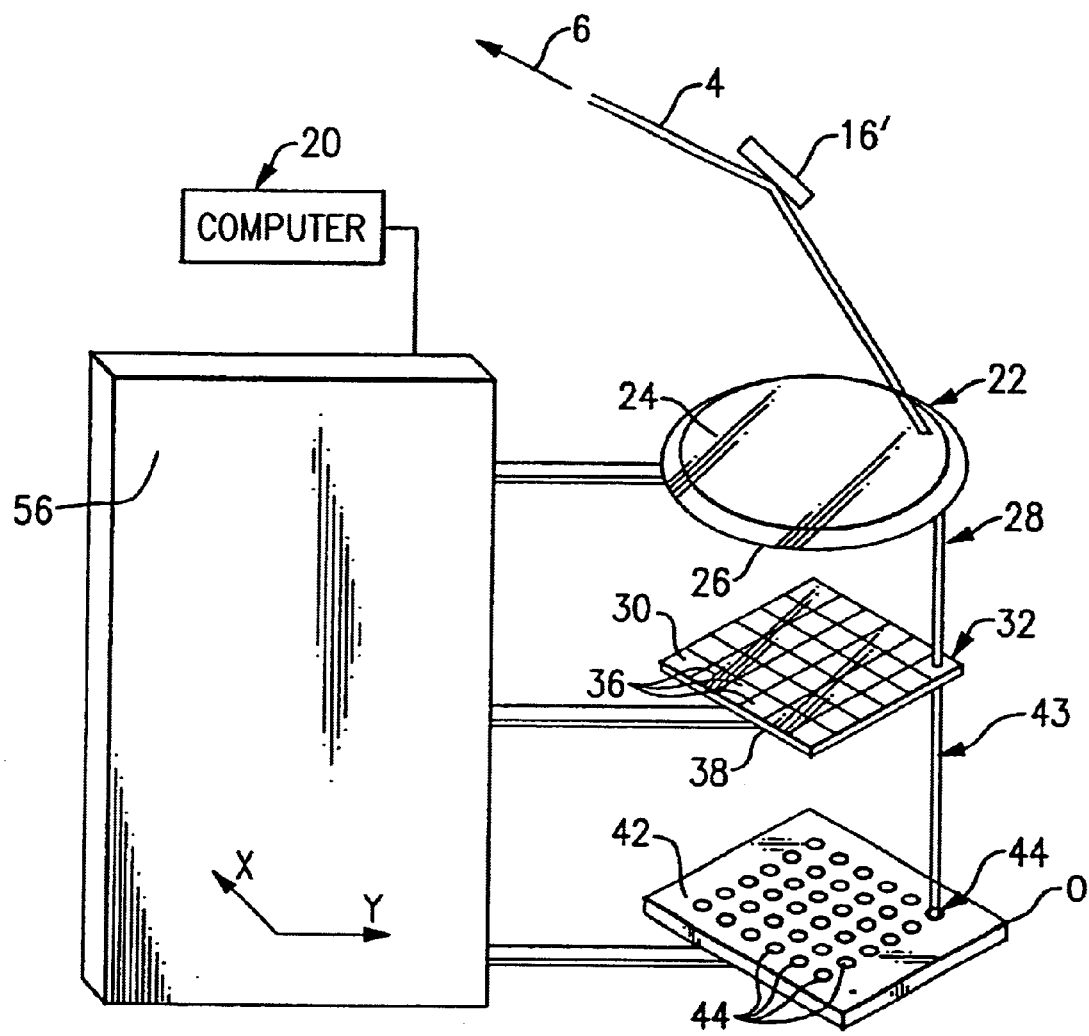
FIG. 9 is a diagrammatic perspective view of a fifth embodiment of the laser imaging system, according to the present invention.
Figure 10:
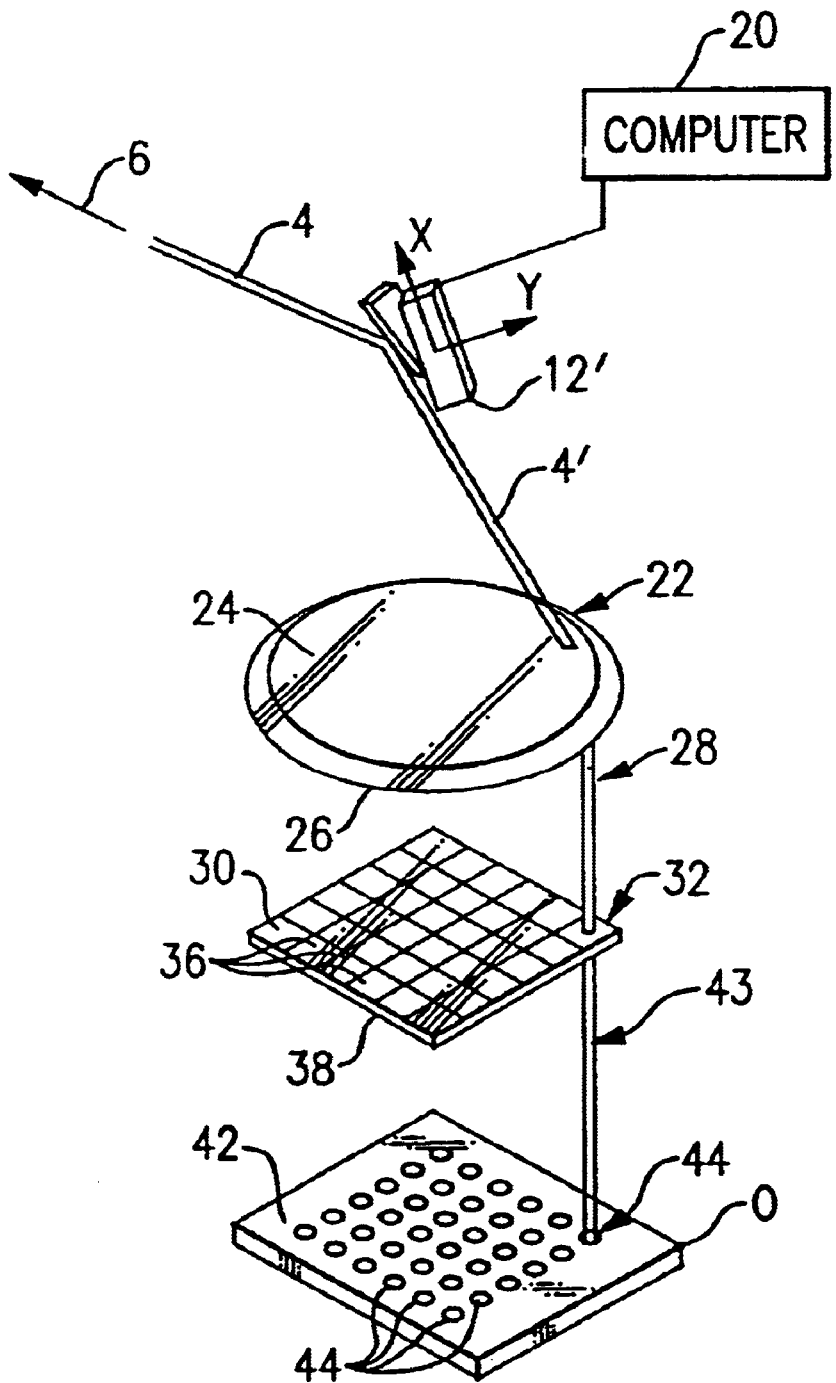
FIG. 10 is a diagrammatic perspective view of a sixth embodiment of the laser imaging system, according to the present invention.

It is to be appreciated that the imaging system 1, of the present invention, can be used to perforate a plurality of small orifices or holes (see FIG. 8), in a single or a multi-layered material, to enable the formation of a desired nozzle array for use in forcing a liquid (e.g. a perfumed, a solvent, a pharmaceutical, a chemical, etc.) therethrough to result in a desired spray configuration or pattern. The force fluid, upon exiting from the nozzle array, is atomized into small minute particles and dispersed in a desired spray configuration at a target. The imaging system, according to the present invention, allows the formation of such orifices, nozzles, holes, etc., in a variety of different materials including, but not limited to, stainless steel, polyamide, lexan, brass, molybdenum, copper, aluminum, etc, for example.

The present invention is also well-suited for forming a set of miniature surface markings on an interior surface adjacent a breech end of a gun barrel of a firearm. In particular, the present system can be employed to form a desired unique bar code, matrix, an alpha numeric code, or any desired identifying indicia on an inner surface of the firearm, adjacent the breech end of the gun barrel. Once the gun barrel is suitably processed or marked with the identifying indicia, when the firearm is discharged in a conventional manner, the loaded gun shell normally expands slightly, due to the gunpowder within the gun shell instantaneously igniting and heating the gun shell. This rapid expansion of the gun shell causes the exterior surface of the gun shell to be forced against the inwardly facing surface adjacent the breech end of the gun barrel such that the identifying indicia, formed on the inwardly facing surface of the breech end of the gun barrel, forms a mating or matching impression or marking on the exterior surface of the gun shell. Upon discharge of the gun shell from the gun barrel, this matching impression or marking facilitates identifying which gun shell was discharged from which gun barrel. Such marking of the gun shell assists ballistics experts with confirming that a particular gun shell was discharged from a particular barrel of a firearm. If desired, a plurality of identical miniature surface markings can be formed, at spaced locations about the interior surface adjacent the breech end of a gun barrel of a firearm, to make it more difficult for an end user to located and completely remove all of such miniature surface markings from the interior surface of the breech end of the gun barrel so processed or marked.

It is to be appreciated that a plurality of identical imaging systems 1, each similarly to any one of the above described embodiments, can be simultaneously used in combination with one another to form, drill or burn a desired matrix of features in the same object to be processed O. Further, it is to be appreciated that there are a variety of different arrangements that could be utilized to move the object to be processed O relative to the focused beam 43. For example, the object O, the field collimating lens other holographic component 22, and the holographic imaging lens 32 can all be mounted on a table 56 which is movable in the X-axis and the Y-axis directions and coupled to the computer 20 for controlling movement of the table 56 relative to the focused beam 43 (FIG. 9). Alternatively, the X-axis Y-axis repeat positioner 14, 18 can be replaced with a single mirror mounted on a table 12' and movable in both the X- and Y-axis directions (FIG. 10). This table 12' is also coupled to the computer 20 and appropriately moves to redirect the light beam 4 to a desired rear surface of the field collimating lens other holographic component 22 to facilitate illumination of a desired one of the holographic imaging segments 36. As such teaching in conventional and well known in the art, a further detailed description concerning the same is not provided.

Figure 11:
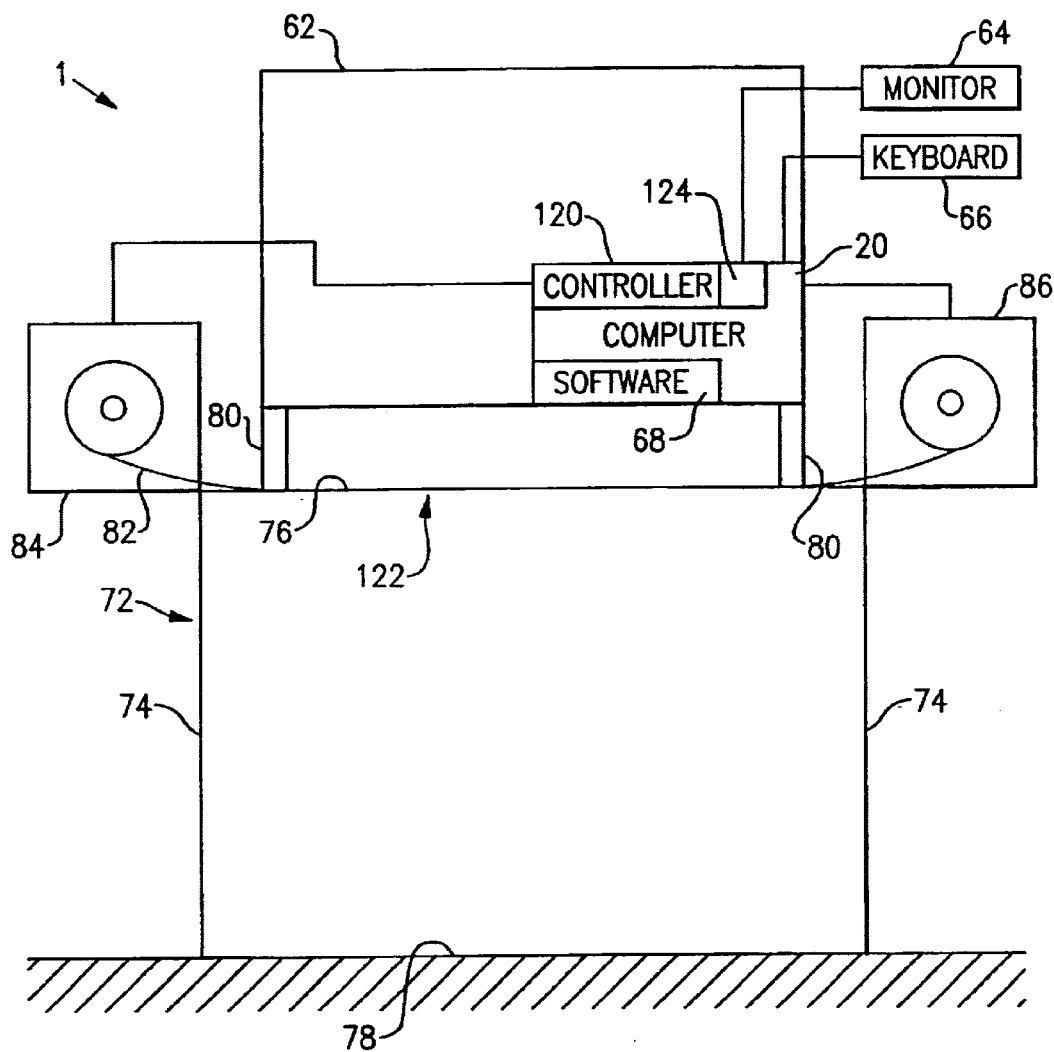
FIG. 11 is a diagrammatic view showing peripheral components for use with the imaging system according to the present invention.

With reference to FIG. 11, an embodiment is shown in which the entire imaging system 1 is diagrammatically housed within an enclosure 62. The enclosure 62 also accommodates the computer 20 which is coupled, as described above, to control operation of the imaging system 1. In addition, a monitor 64 as well as a keyboard 66 are coupled to the computer 20. The keyboard 66 facilitates inputting of a desired command(s), by an end user, to the computer 20 for controlling operation of the imaging system 1 and the monitor 64 facilitates viewing of any such entered command(s) as well as viewing of any warnings, error(s), messages, instructions, queries, data, information, etc., to be displayed by the imaging system 1. Computer software 68 is incorporated, in a conventional manner, into the computer 20 which facilitates operation and control of the laser 2 and the X-axis and Y-axis automated repeat positions 14, 18 as well as controlling relative movement between the object to be possessed O a remainder of the imaging system 1.

The support frame 72 generally comprises four legs or sides 74 (only two of which are shown in FIG. 11) which facilitates supporting a top working surface 76 at a desired distance from a floor or ground surface 78. As can be seen in FIG. 11, all of the components of the imaging system 1 are housed within the enclosure 62 which is suspended, at a fixed location by additional framework 80, a desired working distance D above a central area of the working surface 76. A desired object to be processed or marked 82 with blind via(s), aperture(s), opening(s), indicia, indentation(s), feature(s) or other surface formation(s) 44, e.g. a flexible coated or uncoated web, can be unwound and dispensed via a conventional web dispensing equipment 84 and conveyed across the working surface 76 of the imaging system 1 of the present invention. As the desired object to be processed or marked 82 is conveyed across the working surface 76, the top surface of the desired object to be marked 82 is suitably marked, e.g. formed, burnt or drilled, with the desired blind via(s), aperture(s), opening(s), indicia(s), indentation(s), feature(s) or other surface formation(s) 44.

Following such marking, the processed object to be marked 82 is then rewound by conventional rewinding equipment 86 and ultimately conveyed, in a known manner, to other operation(s) for further processing. It is to be appreciated that the dispensing equipment 84 and the rewinding equipment 86 are both coupled to the computer 20, via conventional electrical couplings, to facilitate control of either uniform sequential indexing or continuous feed, of the desired object to be processed or marked 82, at a desired processing speed along the working surface 76 of the imaging system 1 to facilitate marking of the desired object to be processed or marked 82 at a desired production rate.

Figure 12:
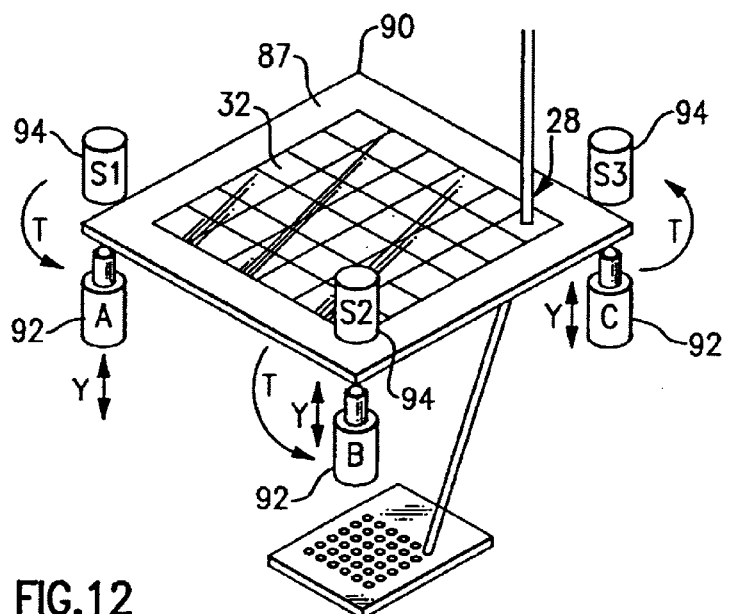
FIG. 12 is a diagrammatic perspective view showing a horizontal adjustment mechanism for the holographic imaging lens.

In a preferred form of the present invention, the holographic imaging lens 32 is supported by a holographic imaging array plate 87 which is mounted by a horizontal adjustment mechanism 88 (FIG. 12) to facilitate aligning the horizontal plane P of the holographic imaging lens 32 so that this horizontal plane is position exactly parallel with the top working surface 76 of the imaging system 1. To facilitate such alignment, preferably one corner or portion of the holographic imaging lens 32 is fixedly mounted 90 to the enclosure 62 (not shown in detail) but that corner is allowed to pivot relative thereto. Each of the three other corners or portions of the holographic imaging lens 32 are also supported by a separate linear actuator 92. Each one of these three linear actuators 92 is coupled to a mating position sensor feedback device 94 and all of the linear actuators 92 and their associated position sensor feedback devices 94 are coupled to the computer 20 to facilitate controlling operation of those components.

Prior to processing of the desired object by the imaging system 1, the computer 20 sequentially actuates each one of the imaging segments 36, comprising the holographic imaging lens 32, to confirm that the working distance D between the holographic imaging lens 32 and the working surface 76 of the imaging system 1 are correctly positioned and/or that the holographic imaging lens 32 is aligned exactly parallel with respect to the working surface 76. In the event, that any adjustment of the holographic imaging lens 32 relative to the working surface 76 of the imaging system 1 is required, a suitable one or ones of the linear actuators 92 is/are supplied with electrical power to operate an internal drive (not shown in detail) in a first direction to raise that end portion of the holographic imaging lens 32, along a Z-axis extending perpendicular to the working surface 76, by a suitable distance, or in an opposite direction, along the Z-axis extending perpendicular to the working surface 76, to lower that end portion of the holographic imaging lens 32 by a suitable distance. Once this occurs, the computer 20 then again actuates each one of the imaging segments 36 to verify whether on not the holographic imaging lens 32 is properly horizontally aligned with the working surface 76. This alignment procedure continues until the computer 20 determines that the holographic imaging lens 32 is suitably horizontally aligned with respect to the working surface 76.

Figure 13:
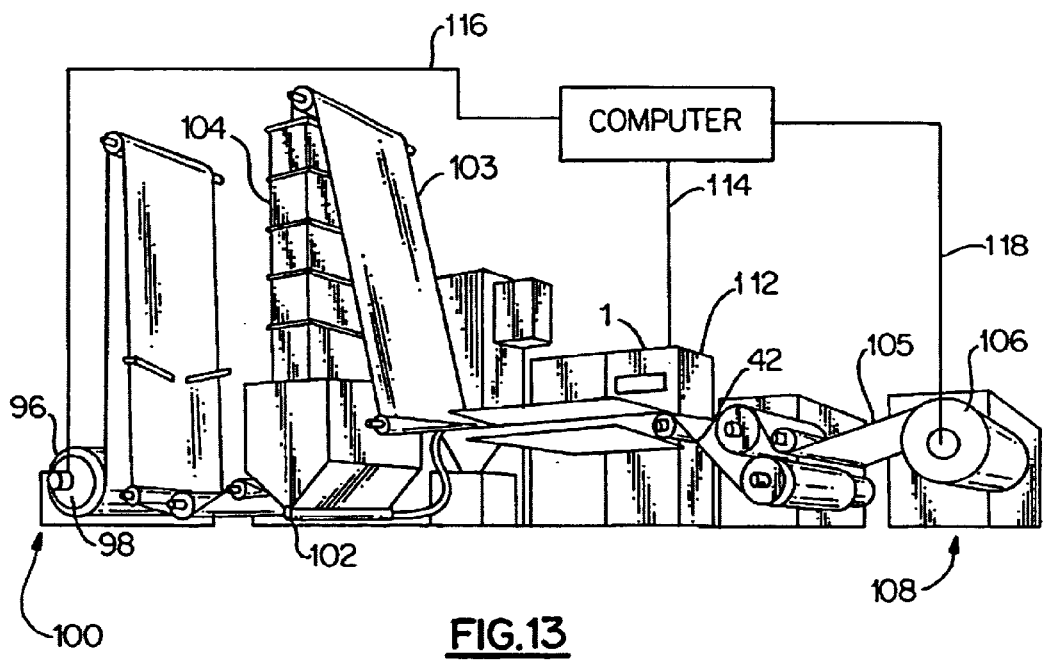
FIG. 13 is a diagrammatic perspective view showing incorporation of the imaging system, according to the present invention, as part of a production line for processing a web.

With reference to FIG. 13, incorporation of the imaging system 1, according to the present invention, as a component and incorporated in part of a production line, will now be briefly described. As can be seen in FIG. 13, an uncoated web 96 is initially manufactured by a conventional process and wound a core 98. The core 98 is supported by conventional dispensing or unwinding equipment 100 to facilitate unwinding of the uncoated web 96 in a uniform manner. During operation, the uncoated web 96 is transported, as is typical in this art, over a plurality of spaced rollers (not numbered) and fed into an inlet of a powder coater 102 where a suitable coating, e.g. powder, metal deposition, dielectric deposition, is applied to either one or both opposed surfaces of the uncoated web 96. The thus coated web 103 is then conveyed through an oven 104 where the heat emitted from the oven facilitates adhesion of the powder coating to one of both surfaces of the coated web 103.

Next, the coated web 103 is conveyed over a plurality of spaced rollers (not numbered) and fed across the working surface 76 of the imaging system 1, according to the present invention, where the desired blind via(s), aperture(s), opening(s), indicia(s), indentation(s), feature(s), or other surface formation(s) 44 are formed, burnt or drilled, as described above, in the top surface 42 of the coated web 103. Finally, the coated and appropriated processed or marked coated web 105 then passes over a plurality of spaced conventional rewind rollers (not numbered), to facilitate proper rewinding of the coated and appropriated processed or marked coated web 105, and is wound on a rewound core 106 by conventional rewind equipment 108. The rewound core 106 of suitably coated and appropriated processed or marked web 105 can then be further processed, as required by conventional equipment in a known manner.

In a preferred form of the invention, a machine vision camera 112 (only diagrammatically depicted in FIG. 13) is coupled to the computer 20 of the imaging system 2, via a conventional cable 114, for observing the object to be processed O to view the drilling, burning, and/or formation of the desired blind via(s), aperture(s), opening(s), indicia (s), indentation(s), feature(s), or other surface formation(s) 44 in a desired surface of the object to be processed O. Once the desired blind via(s), aperture(s), opening(s), indicia(s), indentation(s), feature(s), or other surface formation(s) 44 are formed, burnt or drilled in the object to be processed O by the imaging system 2, the object to be processed O can then be further manipulated by the production line, e.g. be rewound on a core, can be package or further conveyed, etc., depending upon the particular application. The computer 20 is typically electrically connected, by a cable 116 and 118, to motors (not shown) which control drive of the dispensing or unwinding equipment 100 and the rewinding equipment 108 for controlling further manipulation or manufacturing, inspection, transportation, processing, sorting, orientation, etc., of the object to be processed O. As such teaching is well known in the art and as the present invention primarily relates to the imaging system 2, a further detailed description concerning the machine vision camera 112 and its associated components are not provided.

The improved control system for the laser 2, the X-axis and Y-axis repeat positioners 14, 18 and the relative movement of the product to be imaged O, e.g. conveyance of the product via a movable table or conveyor or movement of the product to be imaged O relative to the other two components, according to the present invention, will now be discussed. The present invention employs a controller 120 (FIG. 11), which is incorporated in the computer 20, which synchronizes operation of the X-axis and Y-axis repeat positioners 14, 18, the product handling system for the product to be imaged O (for moving the product along the X- and Y-axes relative to the other two components) generally designated as 122, and the laser 2, so that all three components operate at an optimum performance level to facilitate increased production efficiency.

The controller 120, according to the present invention, generates the necessary commands to drive the X-axis and/or Y-axis repeat positioners 14, 18, the product handling system 122 for the product to be imaged O and/or the laser 2. The controller 120, according to the present invention, is designed to employ one of the following three command structures, or variations thereof as discussed below, to increase the stepping speed of the X-axis and/or Y-axis repeat positioners 14, 18, across the field of the product to be imaged O, the X-axis and/or the Y-axis movement of the product handling system 122 for the product to be imaged O and the laser 2, to reduce any undesired wait, delay or dwell time of the laser 2, the product handler or a cutting tool and thereby increase the production speed of the product to be imaged O.

During set up of a product to be processed O, the system starts at step 200 (FIG. 14), and the end user, the operator or the system programmer is first allowed to input or select, at step 210, the frequency that the imaging system 1 will operate—the frequency range generally is between 1 and 100 kHz. The end user, the operator or the system programmer is also allowed, at step 220, to input the desired number of pulses—the pulse range generally is between 1 and 100,000 pulses. The frequency and number of pulses determine the duration of the laser beam when fired by the laser 2. The maximum frequency of these pulses, at a 50 percent duty cycle, provides the necessary minimum pulse width.

Next, the end user, the operator or the system programmer selects one of the following command structures, at step 230, to control operation of the above three components and facilitate increased production of the product to be processed.

The first command structure, according to the present invention, operates as follows:

$$PO_{ab}=O1,O2,W,F,N$$

where a and b must be defined as part of a special set of two sets hard-coded axes (i.e. either always the X and Y-axes or the Z and W);

O1 is the offset sent to the first axis (i.e. one of the repeat positioners);

O2 is the offset sent simultaneously to the second axis (i.e. the other of the repeat positioners);

W is the time the imaging system will wait, in milliseconds, once all the components are correctly position prior to firing the laser;

F is the frequency of the laser; and

N is the number of pulses of the laser to be sent.

Figure 15:
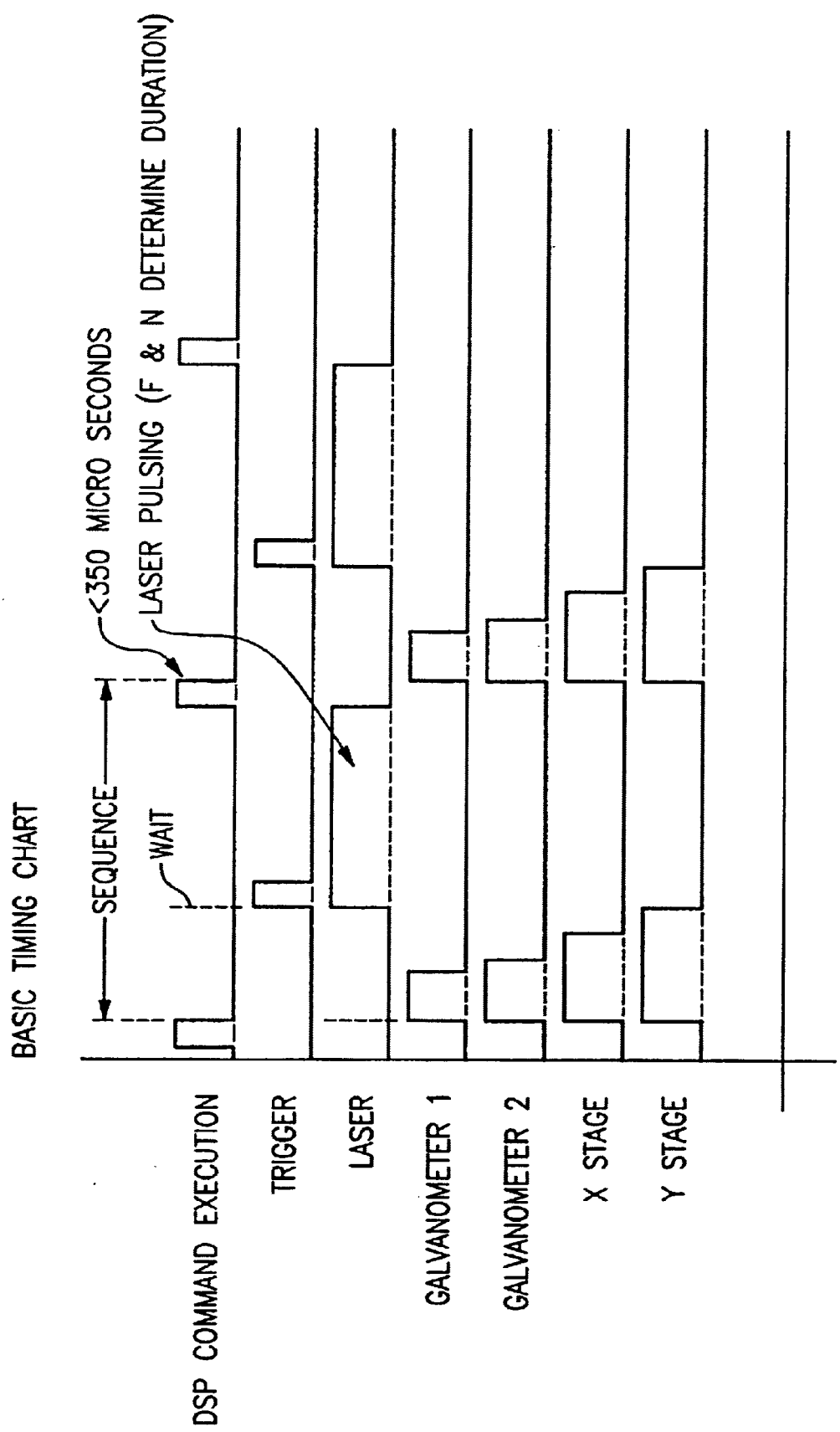
FIG. 15 is a diagram showing an example of a timing chart achieved by the flow diagram of FIG. 14.

The controller 120 (e.g. the digital signal processor (DSP)) then reads, from the drill position data table 124, e.g. the memory device of FIG. 13, at step 240, the necessary values which have been previously stored therein in a conventional manner and this read function normally takes 350 milliseconds, as can be seen in FIG. 15. Immediately following the reading step, the controller 120 then simultaneously sends the necessary signals, in a conventional manner at step 250, to execute motion of the X-axis and/or Y-axis repeat positioners 14, 18, the handling system 122 for the product to be imaged O, e.g. the X stage and/or Y stage, and/or the triggering of the laser 2 to the positions read from the drill position data table.

As depicted in FIG. 15, the X-axis repeat positioner (e.g. galvanometer 1), the Y-axis repeat positioner (e.g. galvanometer 2), the X-axis product handler (e.g., X stage) and the Y-axis product handler (e.g. Y stage) are all driven by the controller 120 immediately following completion of the read sequence, at step 240. Once a desired end position by each one of those components being driven by the controller 120 to a designated position is achieved, each component generates and sends, at step 260, a feed back signal which is received by the system controller, at step 270. As is conventionally done in the art, the control routine will monitor the X-axis repeat positioner and the Y-axis repeat positioner to determine when the error signal voltage, for each of the repeat positioners, achieves the desired voltage. When this occurs, the control routine knows that the X-axis repeat positioner and the Y-axis repeat positioner are located at the exact position dictated by the information read from the drill position data table. A feedback position signal for the X-axis product handler and the Y-axis product handler is also conventionally obtained. For example, the control routine will count pulses to determine when the X-axis product handler and the Y-axis product handler are in the exact position dictated by the data read from the drill position data table. As is conventional done in the art, a PID loop is provided to compensate for any overshoot of the X-axis or Y-axis product handlers to precisely locate the X-axis and the Y-axis repeat positioners at the exact desired location.

Once a feed back signal is received from all of the components required to be moved, prior to the firing of the laser 2, a wait period W occurs at Step 275. The wait period W is generally a small programmed delay or dwell time, e.g., between 2–10 microseconds, to allow the moving components to stabilize somewhat prior to firing the laser 2. At the end of the wait period W, the trigger is immediately activated, at step 280, and the trigger, in turn, causes the laser 2 to be fired at step 290, generally on the rise of the trigger, for a predetermined period of time. Therefore, generally another signal will be sent to each of the X-axis and/or Y-axis repeat positioners 14, 18, the X-stage and/or the Y-axis stage of the handling system 122 for the product to be imaged O and/or the laser 2 to again change their positions although the position of one or more of those components may not require movement prior to next firing of the laser 2.

Assuming the controller routine determines, at step 300, that the laser 2 is required to be fired an additional time(s), the control routine returns to step 240 and the controller 120 then reads, from the drill position data table, the next set of necessary values which have been stored therein and the control routine repeatedly repeats steps 250 to 300, as necessary. If the control routine determines that the laser 2 is not required to be fired an additional time, the controller routine ends at step 310.

A second command structure, according to the present invention, operates as follows:

$$Plab = O1, O2, F, N$$

where, similar to the first command, a and b must be defined as part of a special set of two sets hard-coded axes (i.e. either always the X- and Y-axes or the Z and W);
O1 is the offset sent to the first axis (i.e. one of the repeat positioners);
O2 is the offset sent simultaneously to the second axis (i.e. the other of the repeat positioners);
F is the frequency of the laser; and
N is the number of pulses of the laser to be sent.

Figure 14:
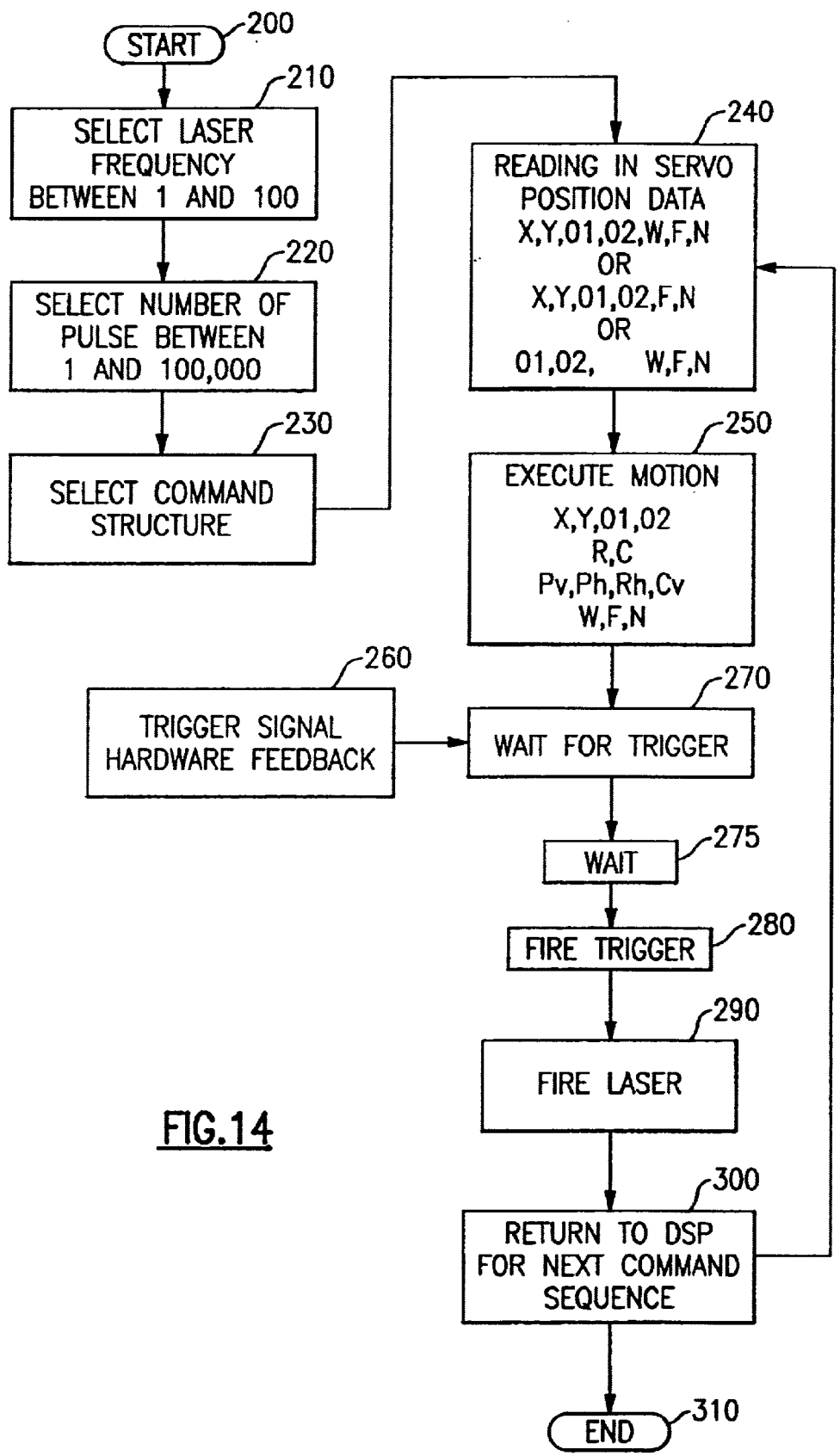
FIG. 14 is a flow diagram showing first embodiments of a command structure for providing improved performance of the imaging system of the present invention.

Accordingly to the second command structure, however, as two digital inputs are utilized, a waiting or dwell time W is not necessary before firing the laser 2, i.e. step 275 of FIG. 14 is eliminated. The second command effectively sets the O1 and O2 offsets for the defined axes. Approximately 1 millisecond after the offsets are sent by the controller 120, the controller 120 will begin polling or checking for a change in state on both of the inputs or the feed back signals. Immediately following the controller 120 detecting a change in state, the trigger is activated and the necessary laser pulses are sent out immediately (e.g. typically less than about 1 millisecond). The maximum delay will, therefore, come from the controller 120 detecting the change of state which is updated on the sample and can be a maximum of one sample period.

A third command structure, according to the present invention, is operates as follows:

$$Plabxy = X, Y, O1, O2, R, C, Pv, Ch, W, F, N$$

where, similar to the first and second commands, a and b must be defined or determined as part of a special set of two sets hard-coded axes (i.e. either always the X- and Y-axes or the Z and W);
X is the X-axis stage offset for the product handling system;
Y is the Y-axis stage offset for the product handling system;
O1 is the offset sent to the first axis (i.e. one of the repeat positioners);
O2 is the offset sent simultaneously to the second axis (i.e. the other of the repeat positioners);
R is the number of steps and repeat rows for the array;
C is the number of steps and repeat columns for the array;
Pv is the pitch distance between each complete array in the vertical direction;
Ph is the pitch distance between each complete array in the horizontal direction;
Rv is the number of complete arrays in the vertical direction with respect to the pitch (Pv and Ph);
Ch is the number of complete arrays in the horizontal direction with respect to the pitch (Pv and Ph);
W is the time the imaging system will wait in milliseconds;
F is the frequency of the laser; and
N is the number of pulses of the laser to be sent.

The third command structure allows a whole array to be stepped and repeated to form rows and columns of individual arrays. This command, as well as variations thereof briefly set forth below, allows the controller 120 to run very efficiently because the command reads from a database at a speed that is several orders of magnitude faster than a read for conventional prior art systems.

The steps for this control routine (see FIG. 16) are substantially identical to that of FIG. 14, and thus not discussed in further, except that an additional step, step 295, is provided between wait step and the step of control routine returning to step 240 to read, from the drill position data table, the next set of necessary drill position data which is stored therein.

Figure 16:
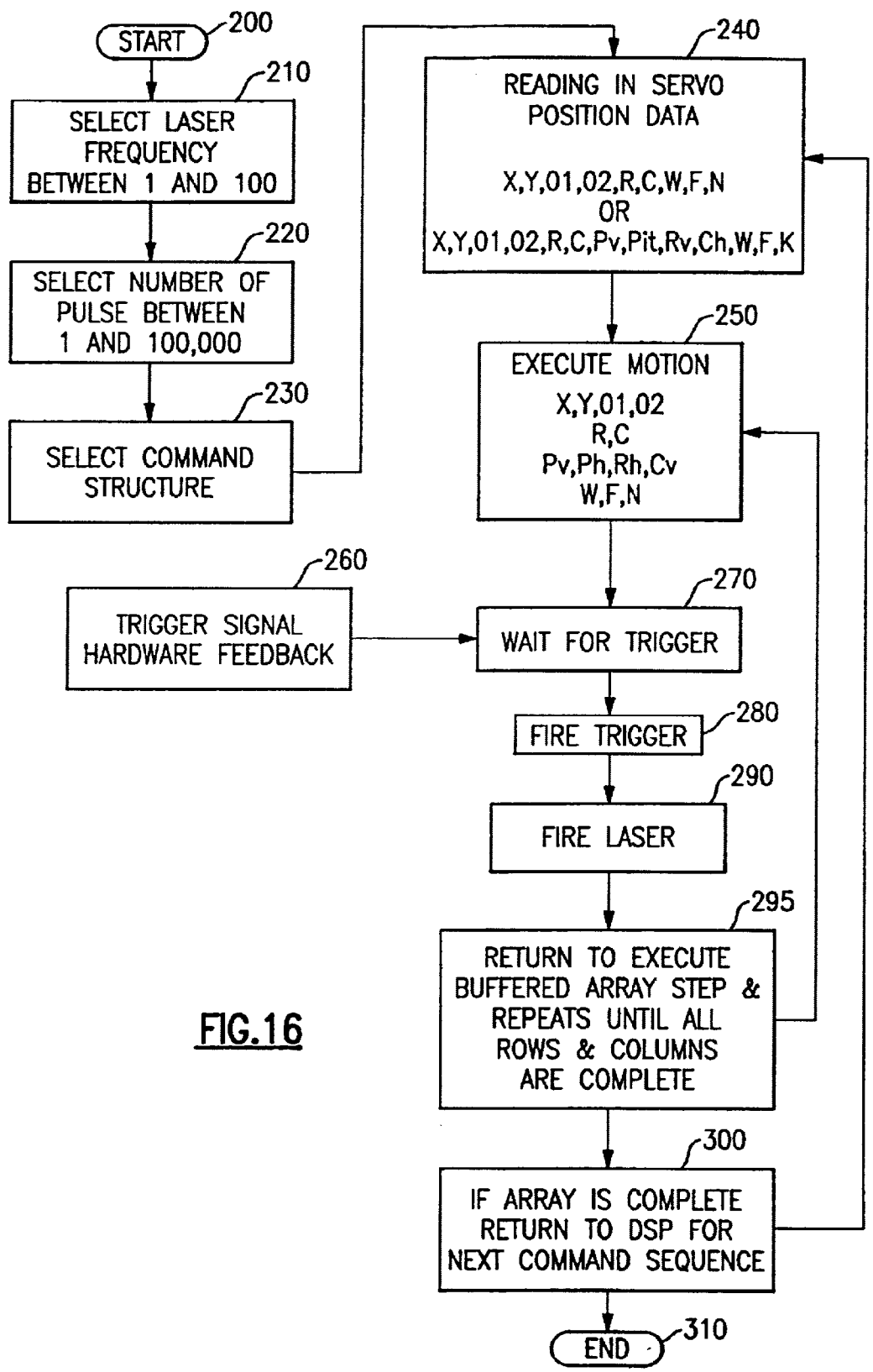
FIG. 16 is a flow diagram showing second embodiments of a command structure for providing improved performance of the imaging system of the present invention.
Figure 17:
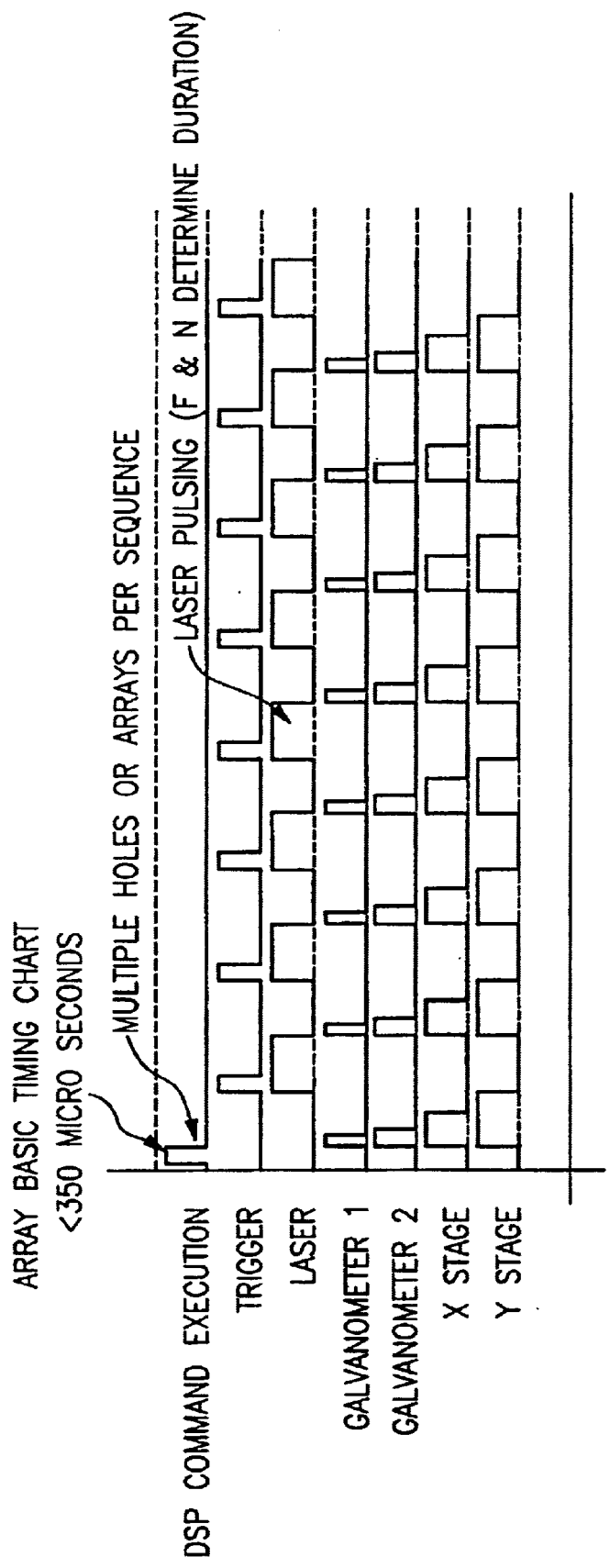
FIG. 17 is a diagram showing an example of a timing chart achieved by the flow diagram of FIG. 16.

A basic timing chart, for the control routine according to FIG. 16, is shown in FIG. 17. As can be seen in that Figure, the controller 120 (DSP command execution) is only executed once while the galvanometer 1, galvanometer 2, the X-stage and the Y-stage are moved to a plurality of locations and the laser 2 is triggered to fire after each move. This occurs a plurality of times before the controller 120 is required to return and read further information from the drill position data table.

For example, if the imaging system 1 was producing three holes employing either the first or the second command, such command would require the controller 120 to seek and load a separate command sequence (see FIG. 15) following each firing of the laser 2, i.e. three separate seek and load commands. It is to be appreciated that each seek and load sequence of the controller 120 takes 350 microseconds, at a minimum. So the traditional controller command sequence for three holes would be 1,050 microseconds (e.g. 3×350 microseconds) and this time period is equivalent to 1.05 milliseconds.

As the third command is using an array style structure, it would only require one third of that time period, namely, only 350 microseconds, because the controller 120 only seeks and downloads one command, not three separate commands as with the first and second commands, and that single command processes an entire data table of information and requires only one seek and load step—not three separate steps. Accordingly, if the imaging system 1, according to the present invention, were to produce 500 holes per array, such time saving is significant especially when a plurality of 500 hole arrays are to be manufactured. Other variations of the third command are as follows:

$$POabxy = X, Y, O1, O2, W, F, N;$$

$$POabxy = X, Y, O1, O2, F, N; \text{ or}$$

$$Plabxy = X, Y, O1, O2, W, F, N.$$

where, similar to the first and second commands, a and b must be defined or determined as part of a special set of two sets hard-coded axes (i.e. either always the X- and Y-axes or the Z and W);
X is the X-axis stage offset for the product handling system;
Y is the Y-axis stage offset for the product handling system;
O1 is the offset sent to the first axis (i.e. one of the repeat positioners);
O2 is the offset sent simultaneously to the second axis (i.e. the other of the repeat positioners);
W is the time the imaging system will wait in milliseconds;
F is the frequency of the laser; and
N is the number of pulses of the laser to be sent.

The above command structures are also good for other applications including, CNC machining, laser scribing, laser cutting and laser marking or any process that can utilize single line command sequences during production or manufacture of a desired end product.

When triggering preference would need to have its edge trigger on a low to high transition. The signal can either trigger on a high, or low or the transition between those two states. The unique commands, according to the present invention, allow the controller to operate at a much faster speed than is currently available in the prior art.

Suitable lasers, for use with the present invention, will now be briefly discussed. The present invention contemplates use of a variety of different lasers such as a slow flow CO2, CO2 TEA (transverse-electric-discharge), Impact CO2, and Nd:YAG, Nd:YLF, and Nd:YAP and Nd:YVO and Alexandrite lasers. In addition, it is to be appreciated that the imaging system 1, according to the present invention, can utilize all other forms of lasers including gas discharge lasers, solid state flash lamp pumped lasers, solid state diode pumped lasers, ion gas lasers, and RF wave-guided lasers. The above identified lasers are currently available on the market from a variety of different manufacturers.

Figure 18:
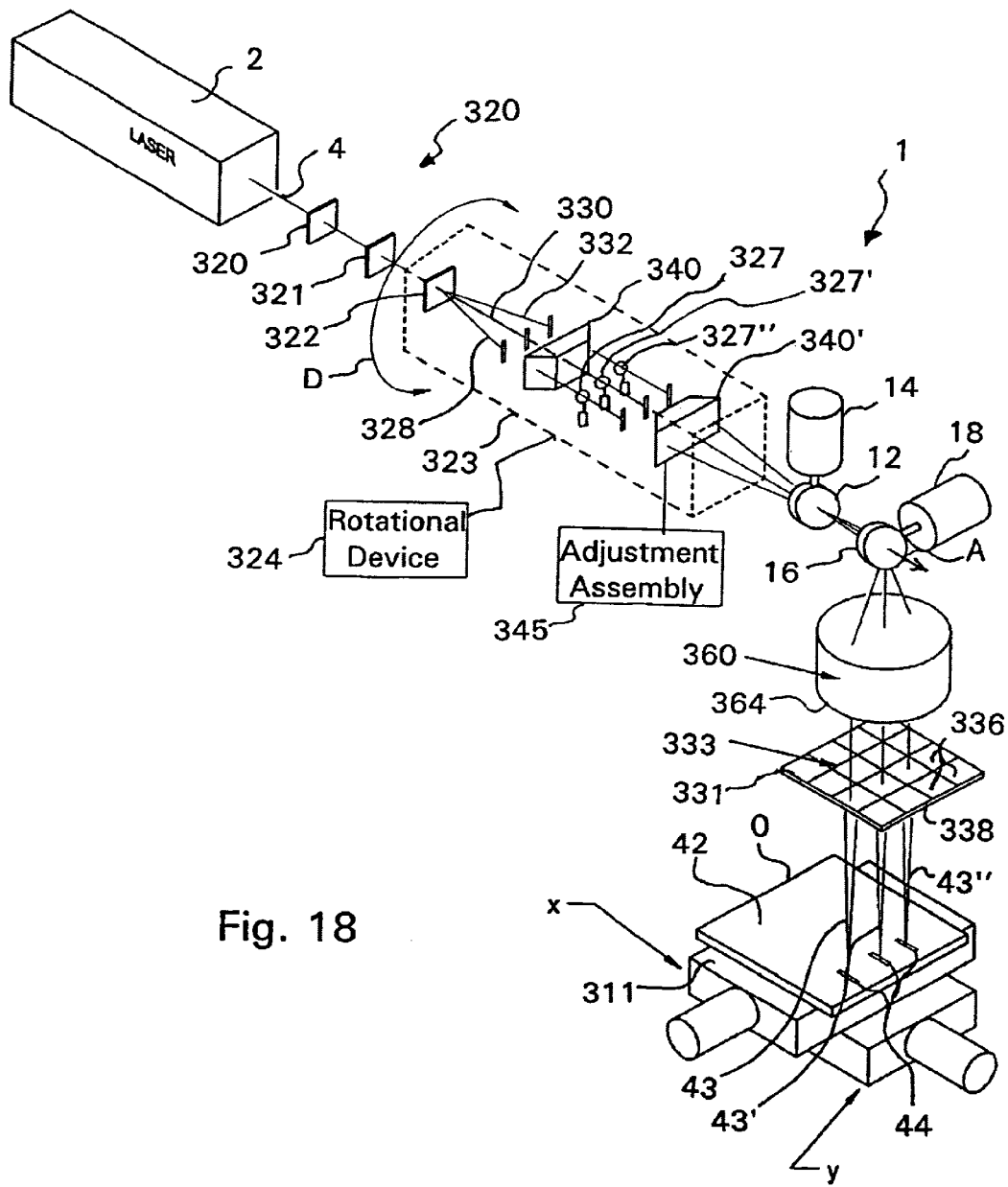
FIG. 18 is a diagrammatic perspective view of a seventh embodiment of the laser imaging system, according to the present invention.

Turning now to FIG. 18, a detailed description concerning a further embodiment of the imaging system 1 apparatus for ablating high-density array of vias or indentations in a surface of an object, according to the present invention, will now be provided. As can be seen in this Figure, a conventional laser 2 is employed for generating and outputting a laser beam 4. It is to be appreciated that the laser 2 can be either excimer or non-excimer laser and further details and operating parameters for the laser will be provided below.

The laser beam 4, generated by the laser 2, is either an ultraviolet, a visible, an infrared, a coherent radiation beam or some other light radiation beam 4 which is supplied along an optical axis A to a laser beam splitter/shaper/collimator apparatus, generally designated by reference numerals 320, 321 and 322 where the emitted laser beam 6 is split into a plurality of equally sized and shaped laser beams, preferably three equally sized and shaped laser beams.

Figure 19:
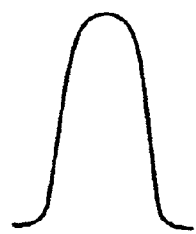
FIG. 19 is a diagrammatic representation showing a wave profile of the emitted initial laser beam.
Figure 20:
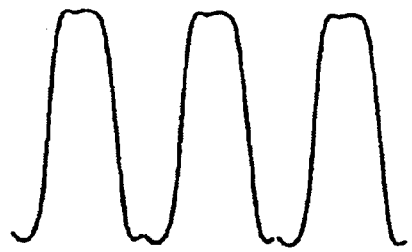
FIG. 20 is a diagrammatic representation showing a wave profile of the three laser beams, at an image plane, following splitting of the initial laser beam into three separate laser beams.

As can be seen in this Figure, the laser beam 6 is directed by the laser 4 at and travels through a first computer generated hologram 320 where the light is collimated. The collimated light exits from the front surface of the first computer generated hologram 320 and is supplied to a rear surface of a second computer generated hologram 321. The second computer generated hologram 321 converts or converges the collimated light from a gaussian profile (see FIG. 19) to a line image profile and emits the line image profile beam from a front surface thereof as a substantially flat top beam or a some other desired wave front beam (see FIG. 20). The light or laser beam having a line image profile then enters the rear surface of a third computer generated hologram 322 where the light beam is split and emitted, from a front surface of the third computer generated hologram 322, toward a first of a pair of illumination prisms 340, 340', i.e., a converging mechanism, as three equally sized and shaped line image profile laser beams 328, 330, 332. Each one of the illumination prisms 340, 340' has a pair of opposed planar surfaces which both extend perpendicular to the optical axis A of the laser beam delivery system 2 and a pair of inclined surfaces which each form an acute angle with the optical axis A of the laser beam delivery system 2. The two illumination prisms 340, 340' are positioned in an opposed relationship to one another. Three shutters 327, 327', 327" (only diagrammatically shown) having a plurality of openable and closable doors are positioned between the two illumination prisms 340, 340' to control the number of separate beams 328, 330 or 332 that are allowed to pass through the three shutters 327, 327', 327" and be directed at the object to be processed O after passing through the second illumination prism 340'.

The two central planar surfaces of the illumination prism 340, which extend perpendicular to the optical axis A of the laser beam delivery system 2, do not redirect the central beam 330 of the three equally sized and shaped laser beams 328, 330, 332, and those two central planar surfaces allow that light to pass directly therethrough without substantially effecting the shape, angle or path of the central beam 330. Each of the pair of inclined surfaces however, alter and/or redirects one of the two collimated outer beams, i.e., one inclined surface redirects collimated beam 328 while the other inclined surface redirects collimated beam 332 so that both of those two beams then travel parallel to one another and to the central beam 330 toward the illumination prism 340'. This redirecting of the two outer beams 328 and 332 allows the three equally sized, shaped and spaced collimated beams 328, 330, 332, each having a line image profile, to pass through the respective shutters 327, 327', 327" and before traveling to the illumination prism 340'.

Figure 21:
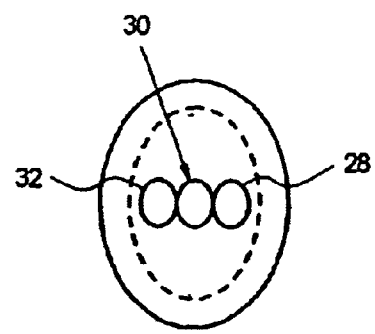
FIG. 21 shows one overlapped arrangement for three beams when passing through the clear aperture of the mirror of a first one of the repeat positioners.

The two central planar surfaces of the illumination prism 340', which extend perpendicular to the optical axis A of the laser beam delivery system 2, do not redirect the central beam 330 of the three equally sized and shaped laser beams 328, 330, 332, and those two central planar surfaces allow that light to pass directly therethrough without substantially effecting the shape, angle or path of the central beam 330. Each of the pair of inclined surfaces however, alter and/or redirects one of the two collimated outer beams, i.e., one inclined surface redirects collimated beam 328 while the other inclined surface redirects collimated beam 332 so that both of those two beams at least partially converge toward one another and/or overlap the central beam 330 at a desired optical distance from the illumination prism 340'. This redirecting of the two outer beams 328 and 332 over the central beam 330 (see FIG. 21) allows the three equally sized and shaped collimated beams 328, 330, 332, each having a line image profile, to pass through the clear aperture CAg of a reflective mirror 12 of the first repeat positioner 14, e.g., a first galvanometer or repeat positioner. According to a preferred form of the present invention, the mirror 12 of the first repeat positioner 14 has a clear aperture CAg with a diameter of about 10 mm.

The second illumination prism 340' is connected to and supported by an adjustment assembly 345, connected to a motor drive (not shown), so that the second illumination prism 340' can be conveyed to and fro along the optical axis A of the laser beam delivery system 2, as necessary, to adjust the degree of overlap of the three equally sized and shaped collimated linear laser beams 328, 330, 332. By adequate control of the second illumination prism 340', the desired convergence of the two outer beams 328, 332 so that they sufficiently overlap the central beam 330 (see FIG. 21) can be achieved so that all three beams 328, 330, 332 pass solely through the clear aperture of mirror 12 of the first repeat positioned 14.

Once all three beams contact and reflect off the first mirror 12, all three beams 328, 330, 332 begin to separate from one another, prior reflecting off the second mirror 16 controlled by the second repeat positioner 18, to a specific pitch and spacing before striking a collimating or an F-Theta lens 360. The expanded three beams 328, 330 and 332 are each then altered, via the inherent optical characteristics of the collimating or F-Theta lens 360 in a conventional manner. The altered light is then emitted from a front surface 364, of the collimating or F-Theta lens 360, toward a rear surface 331 of a holographic imaging lens 333 and where the three separate beams 328, 330, 332 strike and impinge on three desired areas or portions thereof of the holographic imaging lens 333.

The holographic imaging lens 333 is designed such that as each of the three separate beams 328, 330 and 332 enter by way of the rear surface 331 of one of the holographic imaging segments 336, each of the three separate beams 328, 330 and 332 will be focused, by one of the respective holographic imaging segments 336 of the holographic imaging lens 333, at a desired location or locations along a top surface 42 of the object to be processed O. The top surface 42 of the object to be processed O is located at a desired working distance D, for example, between 5 mm and 1000 mm, and preferably between about 200 to 300 mm from the front surface 338 of the holographic imaging lens 333. The altered light from each of the three separate beams 328, 330 and 332 is emitted from the front surface 338 of the holographic imaging lens 333 as focused light beams 43, 43', 43".

The focused light beams 43, 43', 43" are directed at a desired location or locations, depending upon the inherent characteristics of the holographic imaging segment 336, along the top or other desired surface 42 of the object to be processed O for drilling, burning or otherwise forming a desired blind via(s), aperture(s), opening(s), indicia, indentation(s) or other surface formation(s) 44 therein of a desired size and a desired depth.

It is to be appreciated that the size of the formation(s) 44 is determined and/or defined by the design characteristics of each holographic imaging segment 336 of the holographic imaging lens 333. In addition, the depth of the formation(s) 44 is a direct function of the duration or amount of pulses of the laser 2 emitted at the top surface 42 of the object to be processed. That is, the longer the duration and/or greater of the number of pulses of the laser 2, the greater the depth of the desired blind via(s), aperture(s), opening(s), indicia, indentation(s) or other surface formation(s) 44 in the object to be processed O, while the shorter the duration and/or the smaller the number of pulses from the laser 2, the smaller the depth of the desired blind via(s), aperture(s), opening(s), indicia, indentation(s) or other surface formation(s) 44 in the object to be processed O. The object to be processed O is supported on a table 311 which is movable in both the X and Y directions to facilitate formation of the desired blind via(s), aperture(s), opening(s), indicia, indentation(s) or other surface formation(s) 44 at desired locations in the object to be processed O.

According to this embodiment, the third computer generated hologram 322, the first and second central illumination prisms 340, 340', the adjustment assembly 345 and the three individual shutters 327, 327', 327" are all supported by and housed within the rotatable module 323. A rotational drive 324 (only diagrammatically shown) is connected to the rotatable module 323 to facilitate rotation of the rotatable module 323 relative to the optical axis A in either rotational direction D. Due to this arrangement, as the rotatable module 323 is rotated a desired amount, e.g., 90° counterclockwise or counter clockwise for example, by the rotatable drive 324 with respect to the optical axis A of the laser beam delivery system 2, the orientation of the three beams 328, 330 and 332, which all initially lie in a horizontal plane as can be seen in FIG. 18, changes to an orientation where all three beams 328, 330 and 332 now lie in a vertical plane (not shown). This facilitates illumination of three holographic imaging segments 336 which all lie in a second row rather than three holographic imaging segments 336 which all lie in a first row extending normal to the second row.

A computer control system is connected to drive for both of the first and the second repeat positioners 14, 18 and is also connected to control the to and fro motion of the illumination optics adjustment assembly 345 along the optical axis A. In addition, the laser 4 and the shutters 327, 327', 327" are connected to and controlled by the control system to control opening and closing of the doors and facilitate control of how many and which laser beams 328, 330 and/or 332 are allowed to pass through the shutters 327, 327', 327". Finally, the table 311 is coupled to the computer control system to control the X and Y direction of movement.

The laser beam 6 may be, for example, an IR beam or UV YAG laser having a wavelength of either 355 nm or 266 nm. Alternatively, a $CO_2$ laser or a Q-Switched $CO_2$ laser having a wavelength of either of 9.3 or 9.4 micron may be utilized. The laser beam preferably emits ultraviolet light having a wave length of 354.7 nm (3rd harmonic of Nd:YAG). Preferably the laser beam 6 has a beam diameter of about 2.8 mm±10% and a laser beam mode is TEM00 (Gaussian). The laser M2 is preferably <1.3 while the polarization ratio is preferably >100:1. The pulse duration is preferably 10 ns while the pulse energy of the laser beam 6 is about 450 MicroJoules.

As used in the appended claims, the term "coherent light beam" is intended to cover ultraviolet, visible, infrared, and/or other types of known light radiation beams employed to form a desired formation in a surface of the object to be processed.

It is to be appreciated that the present invention is applicable to both collimated light as well as non-collimated light.

Since certain changes may be made in the above described method and system, without departing from the spirit and scope of the invention herein involved, it is intended that all of the subject matter of the above description or shown in the accompanying drawings shall be interpreted merely as examples illustrating the inventive concept herein and shall not be construed as limiting the invention.

Wherefore, I/we claim:

1. A laser beam delivery system for ablating a desired array of features in an object to be processed, the laser beam delivery system comprising:

a laser for generating and outputting a coherent laser beam;

a shaping apparatus for receiving the coherent laser beam output by the laser and for shaping the laser beam into a plurality of separate laser beams;

first and second repeat positioners for redirecting a path of the plurality of separate laser beams;

a converging mechanism for redirecting the plurality of separate laser beams through a clear aperture of a reflective mirror of the first repeat positioner;

a focusing member for receiving the redirected plurality of laser beams from the first and second repeat positioners and focusing each of the plurality of laser beams at a desired one of a plurality of holographic imaging segments forming a holographic imaging lens; and each one of the holographic imaging segments, comprising the holographic imaging lens, forming a desired formation in a surface of the object to be processed.

2. The laser beam delivery system according to claim 1, wherein shaping apparatus comprises at least one computer generated hologram and the at least one computer generated hologram splits the light laser beam at an image plane into at least three separate laser beams.

3. The laser beam delivery system according to claim 2, wherein a first illumination prism is located adjacent to an imaging plane for collimating the three separate laser beams generated by the at least one computer generated hologram so that the three separate laser beams are supplied parallel to one another and along an optical axis of the laser beam delivery system.

4. The laser beam delivery system according to claim 3, wherein a second illumination prism is located between the first illumination prism and the mirror of the first repeat positioner so that the three separate laser beams converge toward one another as the three separate laser beams approaching the first repeat positioner so that substantially all of the generated light passes through a clear aperture of the first repeat positioner.

5. The laser beam delivery system according to claim 1, wherein the focusing member is an F-Theta lens is located between the first and second repeat positioners and the object to be processed, and the F-Theta lens is positioned a sufficient distance from the object to be processed so that the laser beam of each of the plurality of separate laser beams is focused at the object to be processed.

6. The laser beam delivery system according to claim 1, wherein the focusing member is an F-Theta lens is located between the first and second repeat positioners and the object to be processed.

7. The laser beam delivery system according to claim 1, wherein the laser beam has a gaussian profile and the shaping apparatus converts the laser beam of the gaussian profile into three separate beams each having a substantially flat top portion profile.

8. The laser beam delivery system according to claim 1, wherein the converging mechanism comprises a converging illumination prism connected to a drive and the drive facilitates conveyance of the converging illumination prism to and fro along the optical axis to facilitate adjustment of a degree of convergence of the plurality of separate laser beams through the clear aperture of the mirror of the first repeat positioner.

9. The laser beam delivery system according to claim 8, wherein the converging illumination prism has a pair of opposed planar surfaces which extend normal to the longitudinal axis of the laser beam delivery system and a pair of inclined surfaces which extend at an acute angle with respect to the optical axis of the system to facilitate converging of the laser beams through the clear aperture of the mirror of the first repeat positioner.

10. The laser beam delivery system according to claim 1, wherein a computer generated hologram, first and second illumination prisms and three individual shutters are all supported by and housed within a rotatable module, and a rotational drive is connected to the rotatable module to facilitate rotation of the rotatable module relative to the optical axis of the laser beam delivery system.

11. The laser beam delivery system according to claim 1, wherein the coherent light beam is one of an ultraviolet coherent light beam, an invisible coherent light beam, and a coherent radiation coherent light beam.

12. The laser beam delivery system according to claim 1, wherein the first repeat positioner comprises the reflective mirror coupled to an X-axis repeat positioner for controlling a reflection of the plurality of separate laser beams along an X-coordinate and the second repeat positioner comprises a reflective mirror coupled to a Y-axis repeat positioner for controlling reflection of the plurality of separate laser beams along a Y-axis coordinate.

13. The laser beam delivery system according to claim 1, wherein the focusing member is one of a flat field collimating lens, a refractive component, a diffractive component and a holographic component.

14. The laser beam delivery system according to claim 1, wherein the operation of the laser is controlled by a computer, and the computer also controls a position of at least one of the first and second repeat positioners, the focusing member, the holographic imaging lens, and the object to be processed.

15. The laser beam delivery system according to claim 1, wherein the holographic imaging lens is located between 5 mm and 1,000 mm from a top surface of the object to be processed.

16. The laser beam delivery system according to claim 1, wherein the holographic imaging segments are located closely adjacent one another in a planar relationship in an array and form an integral structure.

17. The laser beam delivery system according to claim 1, wherein each one of the holographic imaging segments forms a single desired formation in a surface of the object to be processed.

18. The laser beam delivery system according to claim 1, wherein the focusing member is a holographic imaging lens which receives light from the coherent light beam and redirects the supplied light as a substantially collimated beam at a desired portion of the rear surface of the holographic imaging lens.

19. The laser beam delivery system according to claim 1, wherein the laser beam delivery system further comprises means for selecting the frequency at which the laser will operate when one of burning, drilling or forming a desired formation in a surface of the object to be imaged.

20. The laser beam delivery system according to claim 1, wherein the laser beam delivery system further comprises means for selecting the number of pulses at which the laser will operate when one of burning, drilling or forming a desired formation in a surface of the object to be imaged.

* * * * *